United States Patent
Jung et al.

(10) Patent No.: US 9,627,032 B2
(45) Date of Patent: Apr. 18, 2017

(54) ADDRESS GENERATION CIRCUIT AND MEMORY DEVICE INCLUDING THE SAME

(71) Applicant: SK hynix Inc., Gyeonggi-do (KR)

(72) Inventors: Chul-Moon Jung, Gyeonggi-do (KR); Saeng-Hwan Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 68 days.

(21) Appl. No.: 14/569,392

(22) Filed: Dec. 12, 2014

(65) Prior Publication Data

US 2016/0019944 A1   Jan. 21, 2016

(30) Foreign Application Priority Data

Jul. 21, 2014   (KR) ...................... 10-2014-0091900

(51) Int. Cl.
| | | |
|---|---|---|
| *G11C 11/40* | (2006.01) | |
| *G11C 11/408* | (2006.01) | |
| *G11C 29/00* | (2006.01) | |
| *G11C 11/406* | (2006.01) | |

(52) U.S. Cl.
CPC ........ *G11C 11/4085* (2013.01); *G11C 11/408* (2013.01); *G11C 11/40611* (2013.01); *G11C 29/76* (2013.01); *G11C 29/783* (2013.01)

(58) Field of Classification Search
CPC ............ G11C 11/406; G11C 11/40622; G11C 11/408; G11C 11/40603; G11C 7/1039; G11C 11/4085; G11C 11/40611; G11C 29/76; G11C 29/783

See application file for complete search history.

(56) References Cited

U.S. PATENT DOCUMENTS

| | | | | |
|---|---|---|---|---|
| 4,317,169 A | * | 2/1982 | Panepinto, Jr. | ........ G11C 11/406 365/222 |
| 4,580,236 A | * | 4/1986 | Tsujioka | .................. G09G 5/20 345/443 |
| 4,597,016 A | * | 6/1986 | Nakamura | ........... H04N 1/4175 382/245 |
| 5,146,592 A | * | 9/1992 | Pfeiffer | ................... G06F 5/015 345/505 |
| 5,471,600 A | * | 11/1995 | Nakamoto | ................ G06F 1/03 711/218 |

(Continued)

FOREIGN PATENT DOCUMENTS

| | | |
|---|---|---|
| KR | 1020130127346 | 11/2013 |
| KR | 1020140029018 | 3/2014 |
| KR | 1020150019317 | 2/2015 |

*Primary Examiner* — Hoai V Ho
*Assistant Examiner* — Roberto Mancera
(74) *Attorney, Agent, or Firm* — I P & T Group LLP

(57) ABSTRACT

An address generation circuit may include: a first latch unit suitable for latching an address obtained by inverting a part of an input address; a second latch unit suitable for latching the partly inverted input address of the first latch unit, and suitable for latching an added/subtracted address after a first refresh operation during a target refresh period; a third latch unit suitable for latching the partly inverted input address of the first latch unit during a period other than the target refresh period; and an addition/subtraction unit suitable for generating the added/subtracted address by adding/subtracting a predetermined value to/from the latched address of the second latch unit.

14 Claims, 21 Drawing Sheets

(56) References Cited

U.S. PATENT DOCUMENTS

| | | | | |
|---|---|---|---|---|
| 5,712,999 A * | 1/1998 | Guttag | ................... | G06F 9/355 345/504 |
| 6,122,718 A * | 9/2000 | Ito | ........................ | G11C 7/1018 711/218 |
| 6,226,016 B1 * | 5/2001 | Chee | ........................ | G06T 3/606 345/571 |
| 6,480,874 B1 * | 11/2002 | Aidan | .................... | G06F 7/5055 708/700 |
| 6,646,941 B1 * | 11/2003 | Atwell | ..................... | G11C 7/20 365/222 |
| 7,133,996 B2 * | 11/2006 | Ikeda | .................. | G11C 11/4074 711/206 |
| 7,206,246 B2 * | 4/2007 | Nakashima | .............. | G11C 8/18 365/222 |
| 7,216,198 B2 * | 5/2007 | Ito | ........................ | G06F 11/106 711/106 |
| 9,165,622 B2 * | 10/2015 | Chi | .......................... | G11C 8/04 |
| 9,165,635 B2 * | 10/2015 | Wang | ................. | G11C 11/40615 |
| 9,311,984 B1 * | 4/2016 | Hong | ................. | G11C 11/406 |
| 2015/0085563 A1 * | 3/2015 | Yoon | ................. | G11C 11/40615 365/149 |
| 2015/0340077 A1 * | 11/2015 | Akamatsu | .............. | G11C 29/78 365/96 |

* cited by examiner

ADDRESS GENERATION CIRCUIT AND MEMORY DEVICE INCLUDING THE SAME

CROSS-REFERENCE TO RELATED APPLICATIONS

The present application claims priority of Korean Patent Application No. 10-2014-0091900, filed on Jul. 21, 2014, which is incorporated herein by reference in its entirety.

BACKGROUND

1. Field

This patent document relates to an address generation circuit and a memory device including the same.

2. Description of the Related Art

A memory cell of a memory device includes a transistor serving as a switch and a capacitor for storing an electric charge. According to the electric charge stored in the capacitor of the memory cell, that is, the terminal voltage of the capacitor, data may be determined to be high, corresponding to logic 1, or low, corresponding to logic 2.

Since data is retained in such a manner that electric charge is accumulated in the capacitor, no power is consumed in principle. However, since the initial electric charge stored in the capacitor is lost due to leakage current caused by a PN junction of a MOS transistor or the like, the data may be lost. To prevent such data loss, the data stored in the memory cell must be read and the capacitor must be recharged according to the read information before the data is lost. This operation must be periodically repeated to retain the data. Such a recharging operation is referred to as a refresh operation.

FIG. 1 is a circuit diagram illustrating a part of a cell array included in a memory device. FIG. 1 exemplarily shows the cell array including bit lines BL and 3 word lines WLK−1, WLK and WLK+1, disposed adjacently.

In the cell array of FIG. 1, WLK with HIGH_ACT represents a word line in which the active number or active frequency is high, and WLK−1 and WLK+1 represent word lines arranged adjacent to the word line WLK. Furthermore, CELL_K−1 CELL_K, and CELL_K−1 represent memory cells coupled to the word lines WLK−1, WLK, and WLK+1, respectively. The memory cells CELL_K−1, CELL_K, and CELL_K+1 include cell transistors TR_K−1, TR_K, and TR_K+1 and cell capacitors CAP_K−1, CAP_K, and CAP_K+1, respectively.

In FIG. 1, when the word line WLK is activated or precharged (deactivated), the voltages of the word lines WLK−1 and WLK+1 increase or decrease due to coupling between the word line WLK and the word lines WLK−1 and WLK+1 thereby affecting electric charges stored in the cell capacitors CAP_K−1 and CAP_K+1. Thus, when the word line WLK is frequently activated-precharged or frequently toggles between the active state and the precharge state, data stored in the memory cells CELL_K−1 and CELL_K+1 may be damaged due to a change in electric charges stored in the cell capacitors CAP_K−1 and CAP_K+1.

Furthermore, electromagnetic waves caused by the word line toggles between the active state and the precharge state may make electrons flow into or escape from the cell capacitors included in the memory cells coupled to the adjacent word lines, thereby damaging data of the memory cells.

SUMMARY

Various embodiments are directed to an address generation circuit capable of generating an address for a target refresh operation by latching an address, and a memory device including the same.

Also, various embodiments are directed to an address generation circuit with reduced number of latches for generating an address for a target refresh operation by maintaining or updating values of a latched address according to whether a redundancy operation is performed, and a memory device including the same.

In an embodiment, an address generation circuit may include: a first latch unit suitable for latching an address obtained by inverting a part of an input address; a second latch unit suitable for latching the partly inverted input address of the first latch unit, and suitable for latching an added/subtracted address after a first refresh operation during a target refresh period; a third latch unit suitable for latching the partly inverted input address of the first latch unit during a period other than the target refresh period; and an addition/subtraction unit suitable for generating the added/subtracted address by adding/subtracting a predetermined value to/from the latched address of the second latch unit.

In an embodiment, a memory device may include: a cell array comprising a plurality of word lines and a plurality of redundancy word lines; a first latch unit suitable for latching an address obtained by inverting a part of an input address; a second latch unit suitable for latching the partly inverted input address of the first latch unit, and suitable for latching an added/subtracted address after a first refresh operation during a target refresh period; a third latch unit suitable for latching the partly inverted input address of the first latch unit during a period other than the target refresh period; an addition/subtraction unit suitable for generating the added/subtracted address by adding/subtracting a predetermined value to/from the latched address of the second latch unit; and a control unit suitable for refreshing a word line or redundancy word line corresponding to a counting address, and suitable for refreshing a word line or redundancy word line corresponding to the latched addresses of the second and third latch units during the target refresh period, wherein the counting address changes when the cell array is refreshed.

In an embodiment, a memory device may include: a plurality of banks each comprising a plurality of word lines and a plurality of redundancy word lines; a plurality of first latch units each suitable for latching an address obtained by inverting a part of an input address of a corresponding bank; a plurality of second latch units each suitable for latching the partly inverted input address of the corresponding first latch unit, and suitable for latching an added/subtracted address after a first refresh operation during a target refresh operation; a plurality of third latch units each suitable for latching the partly inverted input address of the corresponding first latch unit during a period other than the target refresh period; an addition/subtraction unit suitable for generating the added/subtracted address by sequentially selecting the plurality of second latch units during a target refresh operation of the target refresh period and adding or subtracting a predetermined value to or from the latched address of the selected second latch unit; and a control unit suitable for refreshing a word line or redundancy word line corresponding to a counting address in the plurality of banks and suitable for refreshing word lines or redundancy word lines corresponding to the latched addresses of the corresponding second and third latch units in the plurality of banks during the target refresh period, wherein the counting address changes when the cell array is refreshed.

In an embodiment, an address generation circuit may include: a first latch unit suitable for latching an address obtained by inverting a part of an input address and a redundancy control signal corresponding to the input address; a second latch unit suitable for latching the partly inverted input address and the redundancy control signal of the first latch unit, suitable for latching an added/subtracted address after a first refresh operation during a target refresh operation when the latched redundancy control signal is disabled, and suitable for maintaining the partly inverted input address when the latched redundancy control signal is enabled; and an addition/subtraction unit suitable for generating the added/subtracted address by adding/subtracting a predetermined value to/from the latched address of the second latch unit.

In an embodiment, a memory device may include: a cell array comprising a plurality of word fines and a plurality of redundancy word lines; a first latch unit suitable for latching an address obtained by inverting a part of an input address and a redundancy control signal corresponding to the input address; a second latch unit suitable for latching the partly inverted input address and the redundancy control signal of the first latch unit, suitable for latching an added/subtracted address after a first refresh operation during a target refresh operation when the latched redundancy control signal is disabled, and suitable for maintaining the partly inverted input address when the latched redundancy control signal is enabled; an addition/subtraction unit suitable for generating the added/subtracted address by adding/subtracting a predetermined value to/from the latched address of the second latch unit; and a control unit suitable for refreshing a word line or redundancy word line corresponding to a counting address, and suitable for refreshing a word line or redundancy word line corresponding to the latched address of the second latch unit during the target refresh period, wherein the counting address changes when the cell array is refreshed.

In an embodiment, a memory device may include: a plurality of banks each comprising a plurality of word lines and a plurality of redundancy word lines; a plurality of first latch units each suitable for latching an address obtained by inverting a part of an input address of the corresponding bank and a redundancy control signal, wherein the redundancy control signal is enabled when a word line corresponding to the input address is replaced; a plurality of second latch units each suitable for latching the partly inverted input address and the redundancy control signal of the corresponding first latch unit, suitable for latching an added/subtracted address after a first refresh operation during a target refresh operation when the latched redundancy control signal is disabled, and suitable for maintaining the partly inverted input address when the latched redundancy control signal is enabled; an addition/subtraction unit suitable for generating the added/subtracted address by adding or subtracting a predetermined value to or from the latched address of the selected second latch unit; and a control unit suitable for refreshing a word line or redundancy word line corresponding to a counting address in the plurality of banks, and suitable for refreshing word lines or redundancy word lines corresponding to the latched addresses of the corresponding second latch units in the plurality of banks during the target refresh period, wherein the counting address changes when the cell array is refreshed.

DETAILED DESCRIPTION

Figure 1:
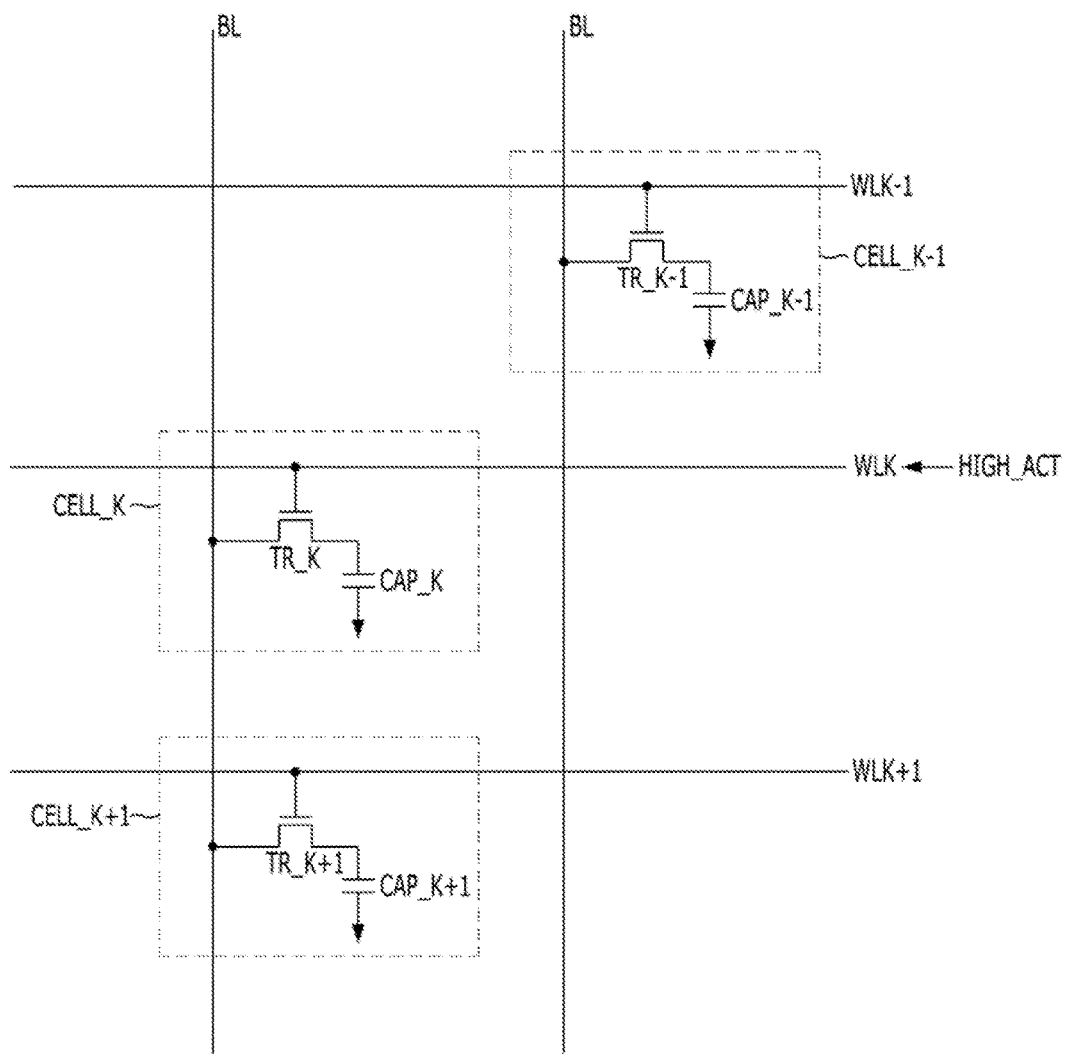
FIG. 1 is a circuit diagram illustrating a part of a cell array included in a memory device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
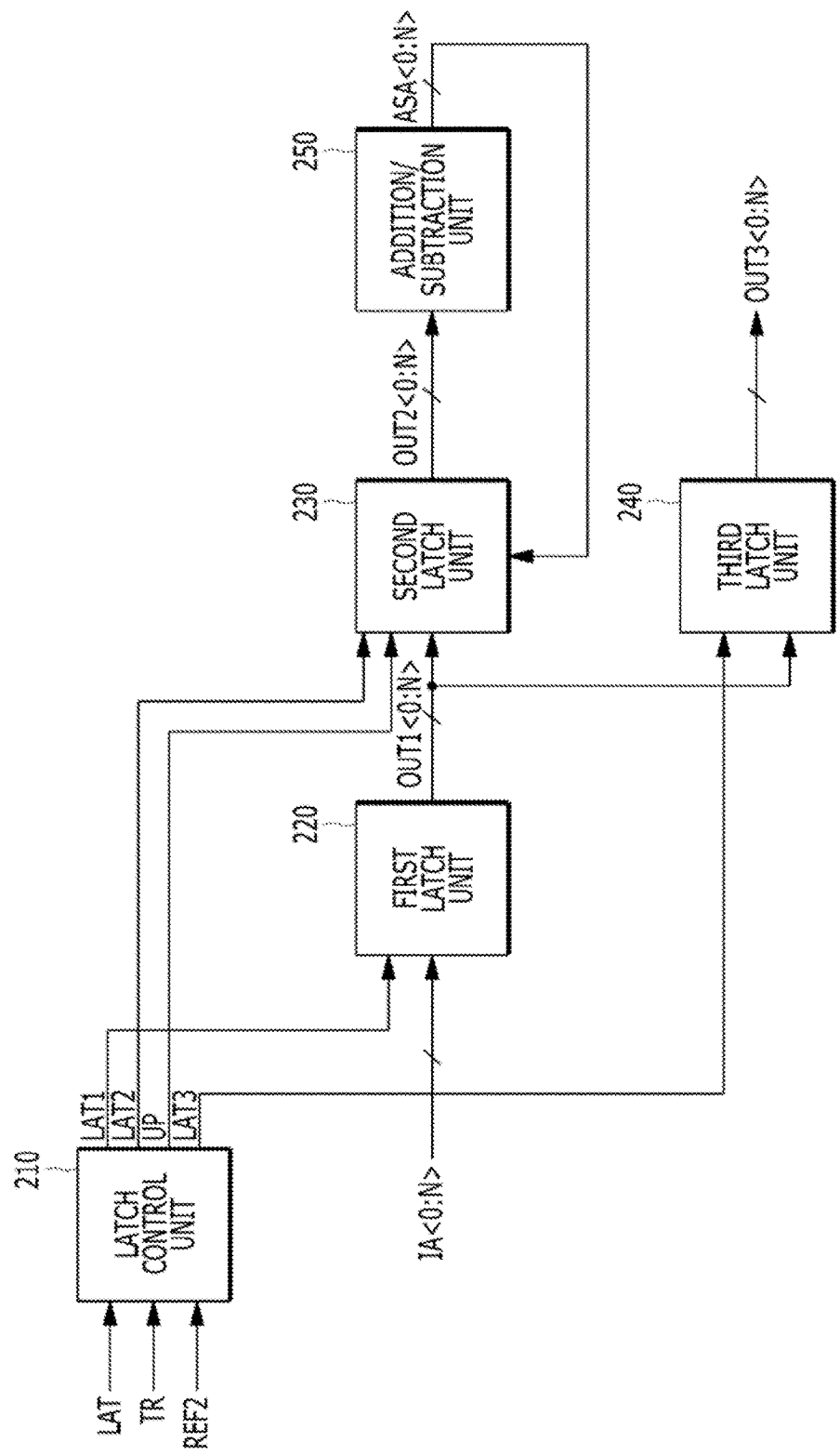
FIG. 2 is a block diagram illustrating an address generation circuit in accordance with an embodiment of the present invention.

FIG. 2 is a block diagram illustrating an address generation circuit in accordance with an embodiment of the present invention.

Referring to FIG. 2, the address generation circuit may include a latch control unit 210, a first latch unit 220, a second latch unit 230, a third latch unit 240, and an addition/subtraction unit 250.

The latch control unit 210 may generate signals LAT1 to LAT3 and UP for controlling the first to third latch units 220 to 240. The latch control unit 210 may enable the first control signal LAT1 when a latch signal LAT is enabled. The latch control unit 210 may maintain the second and third controls signals LAT2 and LAT3 enabled, and disable the second and third controls signals LAT2 and LAT3 in a period where a target refresh signal TR is enabled. The latch control unit 210 may enable the update signal UP after a second refresh signal REF2 is enabled for the first time in the period where the target refresh signal TR is enabled.

When the first control signal LAT1 is enabled, the first latch unit 220 may invert a part of an input address IA<0:N>, for example, a least significant bit (LSB) IA<N> of the input address IA<0:N>, latch the partly inverted input address IA<0:N> and output the latched address as a first output address OUT1<0:N>. For example, when the input address IA<0:N> is '00000000000', the first latch unit 220 may latch and output '00000000001'.

The second latch unit 230 may receive the first output address OUT1<0:N>, latch the received address, and output the latched address as a second output address OUT2<0:N>, in a period were the second control signal LAT2 is enabled. The second latch unit 230 may maintain the latched value therein without reception of the first output address OUT1<0:N> in a period where the second control signal LAT2 is disabled. When the update signal UP is enabled, the second latch unit 230 may receive and latch an added/subtracted address ASA<0:N outputted from the addition/subtraction unit 250.

The third latch unit 240 may receive the first output address OUT1<0:N>, latch the received address, and output the latched address as a third output address OUT3<0:N>, in a period where the third control signal LAT3 is enabled. The third latch unit 240 may maintain the latched value therein without reception of the first output address OUT1<0:N> in a period where the third control signal LAT3 is disabled.

The addition/subtraction unit 250 may receive the second output address OUT2<0:N>, and add or subtract a predetermined value to or from the second output address OUT2<0:N> to generate the added/subtracted address ASA<0:N>. When a part of the second output address OUT2<0:N> (for example, the LSB OUT2<N>) has a first value (for example, '0'), the addition/subtraction unit 250 may add the predetermined value (for example, '2') to the second output address OUT2<0:N>. When the part of the second output address OUT2<0:N> has a second value (for example, '1'), the addition/subtraction unit 250 may subtract the predetermined value from the second output address OUT2<0:N>.

The second output address OUT2<0:N> may be a target address for a word line during a target refresh operation in the memory device. The third output address OUT3<0:N> may be used for controlling a redundancy operation in the memory device. The second output address OUT2<0:N> may be the partly inverted input address IA<0:N> outputted from the first latch unit 220, during a first refresh operation in a target refresh period, and may be the added/subtracted address ASA<0:N> during a second refresh operation in the target refresh period.

Figure 3:
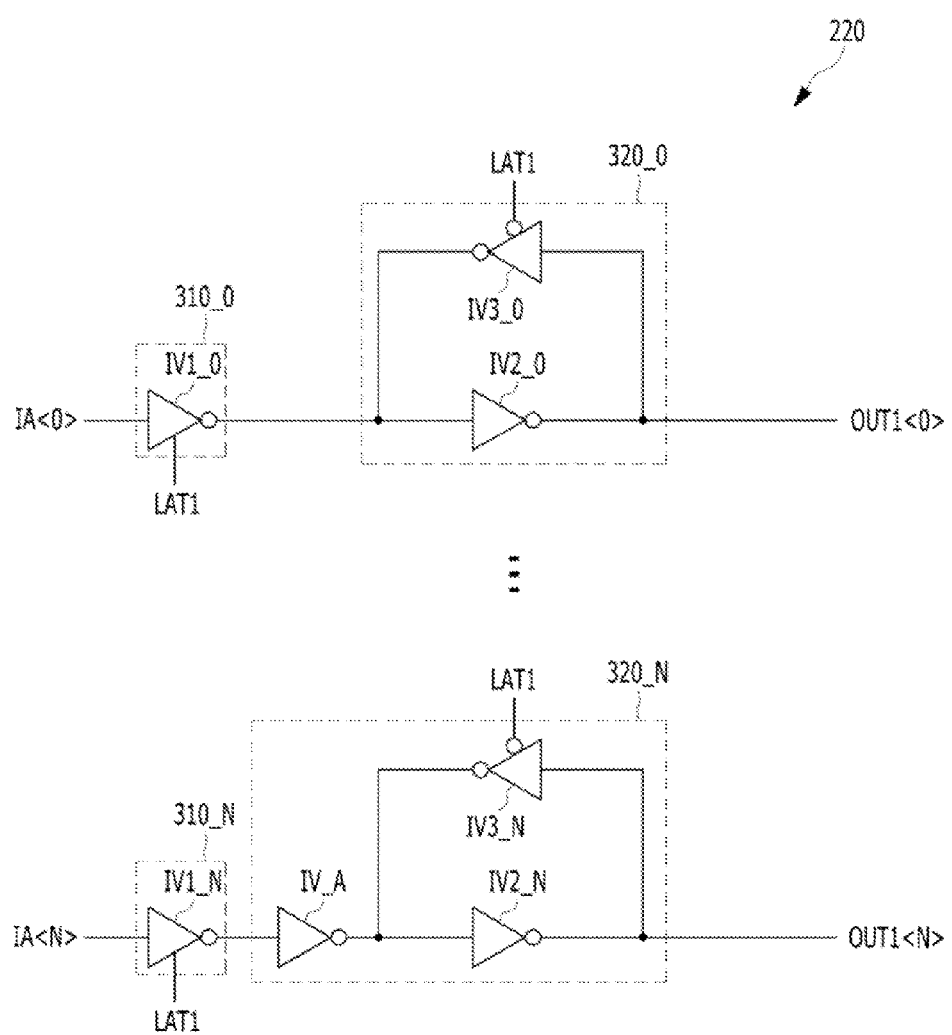
FIG. 3 is a circuit diagram illustrating a first latch unit shown in FIG. 1.

FIG. 3 is a circuit diagram illustrating a first latch unit shown in FIG. 1.

Referring to FIG. 3 the first latch unit 220 may include a plurality of input units 310_0 to 310_N and a plurality of latches 320_0 to 320_N.

Each of the input units 310_0 to 310_N may pass the corresponding bit among the input address bits IA<0> to IA<N> when the first control signal LAT1 is enabled to a high level, for example, and block the corresponding bit when the first control signal LAT1 is disabled to a low level, for example. The input units 310_0 to 310_N may include inverters IV1_0 to IV1_N, respectively, which are turned on/off in response to the first control signal LAT1.

The plurality of latches 320_0 to 320_N may receive and latch the bits IA<0> to IA<N> passed through the corresponding input units 310_0 to 310_N, and maintain the latched values in a period where the first control signal LAT1 is disabled. The latches 320_0 to 320_N may include inverters IV2_0 to IV2_N and inverters IV3_0 to IV3_N which are turned on in a period where the first control signal LAT1 is disabled.

The latch 320_N receiving the LSB IA<N> may include an additional inverter IV_A for inverting and latching the received value. The latch 320_N may receive the corresponding bit IA<N>, and invert and latch the received value.

Figure 4:
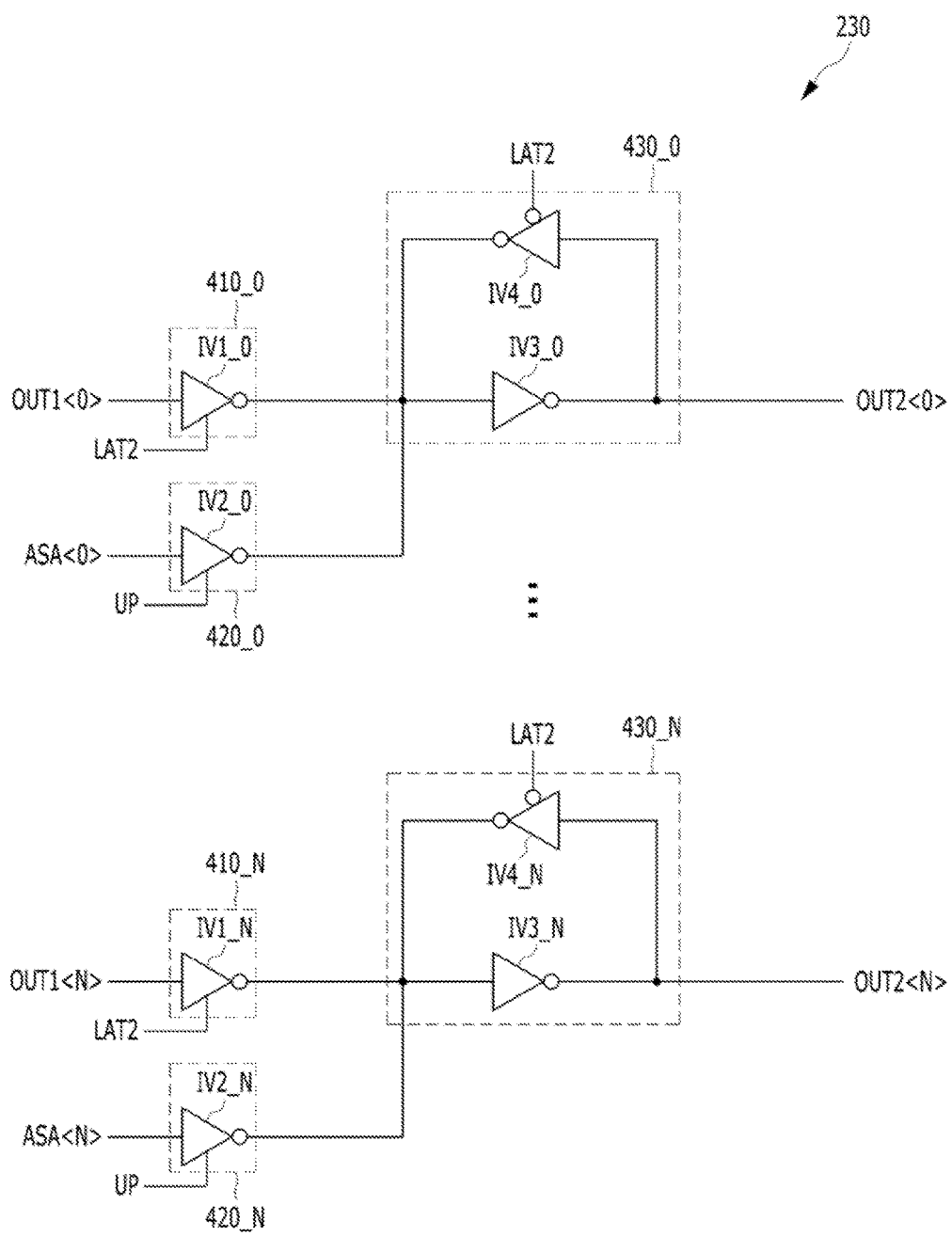
FIG. 4 is a circuit diagram illustrating a second latch unit shown in FIG. 1.

FIG. 4 is a circuit diagram illustrating a second latch unit shown in FIG. 1.

Referring to FIG. 4, the second latch unit 230 may include a plurality of first input units 410_0 to 410_N, a plurality of second input units 420_0 to 420_N, and a plurality of latches 430_0 to 430_N.

Each of the first input units 410_0 to 410_N may pass the corresponding bit among the bits OUT1<0> to OUT1<N> of the first output address when the second control signal LAT2 is enabled to the high level, for example, and block the corresponding bit when the second control signal LAT2 is disabled to the low level, for example. The first input units 410_0 to 410_N may include inverters IV1_0 to IV1_N which are turned on/off in response to the second control signal LAT2.

Each of the second input units 420_0 to 420_N may pass the corresponding bit among the bits ASA<0> to ASA<N> of the added/subtracted address when the update signal UP is enabled to the high level, for example, and block the corresponding bit when the update signal UP is disabled to the low level, for example. The second input units 420_0 to 420_N may include inverters IV2_0 to IV2_N which are turned on/off in response to the update signal UP.

The plurality of latches 430_0 to 430_N may receive and latch the bits OUT1<0> to OUT1<N> or ASA<0> to ASA<N> passed through the corresponding first input units 410_0 to 410_N or the corresponding second input units 420_0 to 420_, and maintain the latched values in a period where the second control signal LAT2 is disabled. The latches 430_0 to 430_N may include inverters IV3_0 to IV3_N and inverters IV4_0 to IV4_N which are turned on in the period where the second control signal LAT2 is disabled.

Figure 5:
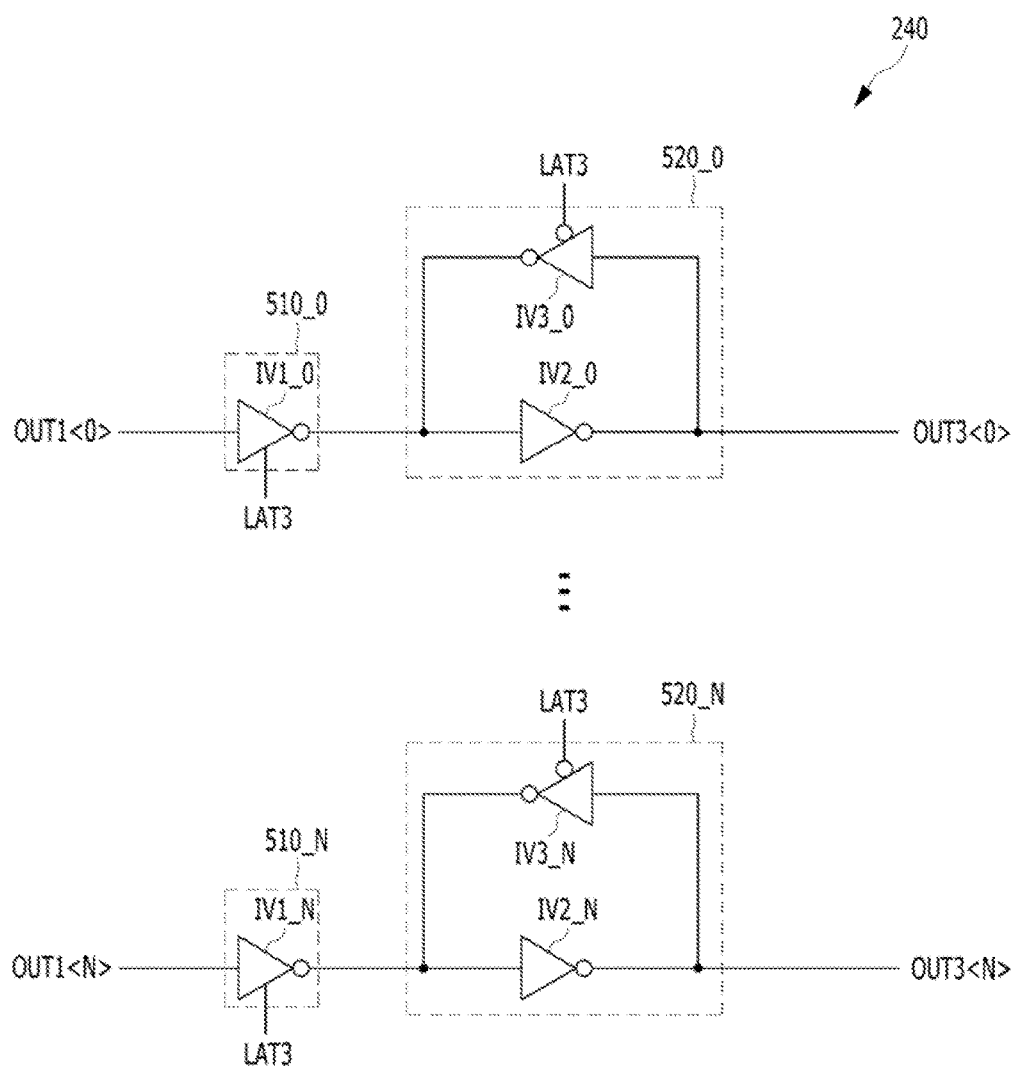
FIG. 5 is a circuit diagram illustrating a third latch unit shown in FIG. 1.

FIG. 5 is a circuit diagram illustrating a third latch unit shown in FIG. 1.

Referring to FIG. 5, the third latch unit 240 may include a plurality of input units 510_0 to 510_N and a plurality of latches 520_0 to 520_N.

Each of the input units 510_0 to 510_N may pass the corresponding bit among the bits OUT1<0> to OUT1<N> of the first output address when the third control signal LAT3 is enabled to the high level, for example, and block the corresponding bit when the third control signal LAT3 is disabled to the low level, for example. The input units 510_0 to 510_N may include inverters IV1_0 to IV1_N which are turned on/off in response to the third control signal LAT3.

The plurality of latches 520_0 to 520_N may receive and latch the bits OUT1<0> to OUT1<N> passed through the corresponding input units 510_0 to 510_N, and maintain the latched values in a period where the third control signal LAT3 is disabled. The latches 520_0 to 520_N may include inverters IV2_0 to IV2_N and inverters IV3_0 to IV3_N which are turned on in a period where the third control signal LAT3 is disabled.

Figure 6:
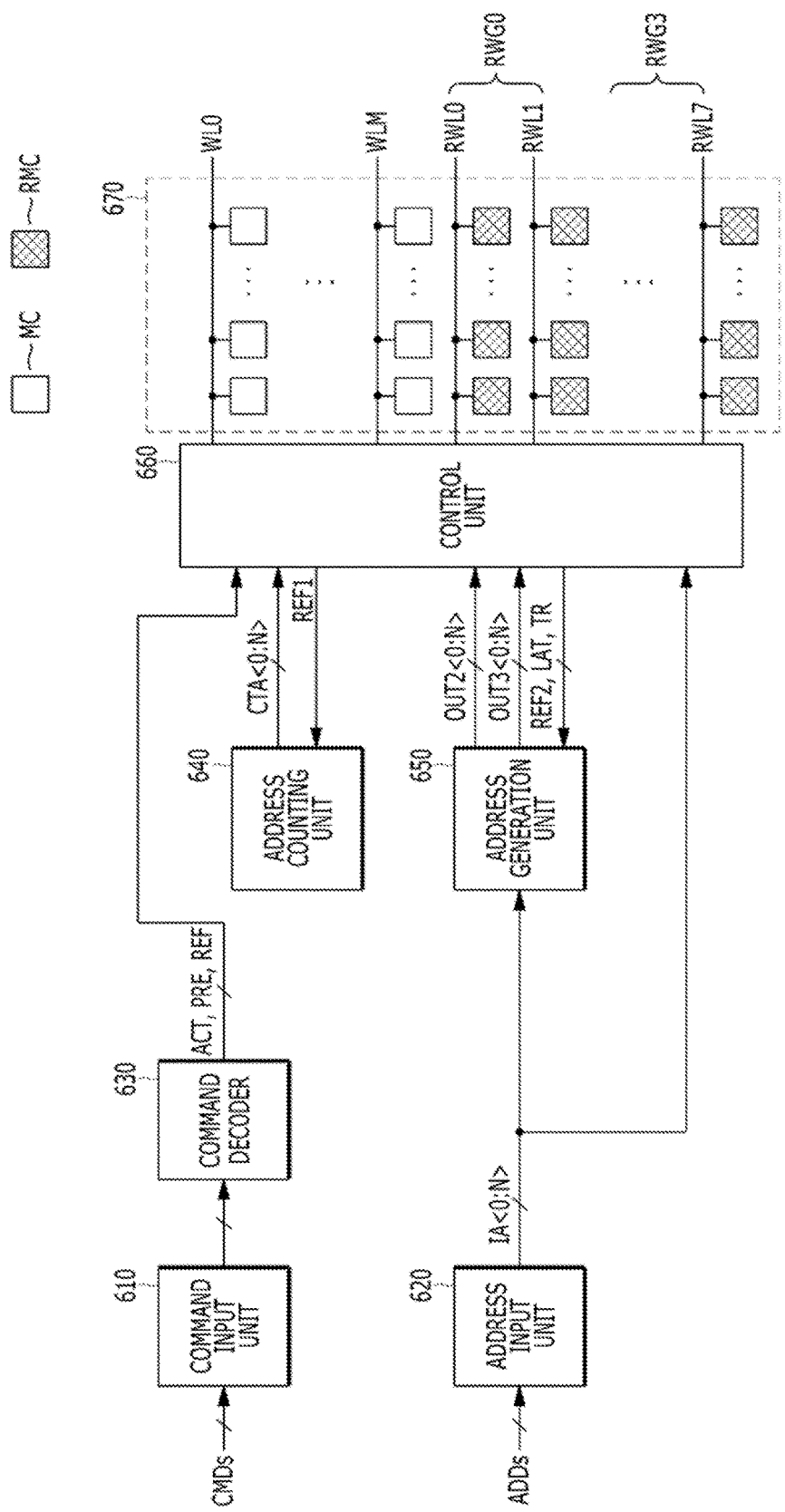
FIG. 6 is a block diagram illustrating a memory device accordance with an embodiment of the present invention.

FIG. 6 is a block diagram illustrating a memory device in accordance with an embodiment of the present invention.

Referring to FIG. 6, the memory device may include a command input unit 610, an address input unit 620, a command decoder 630, an address counting unit 640, an address generation unit 650, and a cell array 670.

Referring to FIGS. 2 to 6, the cell array 670 may include a plurality of normal word lines WL0 to WLM each coupled to a plurality of memory cells MC, and a plurality of redundancy word lines RWL0 to RWL7 each coupled to a plurality of redundancy memory cells RMC. The redundancy word lines RWL0 to RWL7 are replacements for the normal word lines WL0 to WLM. The normal word lines WL0 to WLM may be arranged adjacent to the redundancy word lines RWL0 to RWL7. FIG. 6 exemplarily illustrates the cell array 670 including eight redundancy word lines, but the number of redundancy word lines may differ depending on design.

The plurality of redundancy word lines RWL0 to RWL7 may be divided into four redundancy word line groups RWG0 to RWG3 each including two redundancy word lines. That is, two normal word lines may be replaced with one redundancy word line group. At this time, the addresses of the two normal word lines to be replaced together may be the same as the input address IA<0:N> except for the LSB IA<N>.

The command input unit 610 may receive commands CMDs, and the address input unit 620 may receive addresses ADDs. The commands CMDs and the addresses ADDs may include multi-bit signals.

The command decoder 630 may decode the command signals CMDs inputted through the command input unit 610, and generate an active command ACT, a precharge command PRE, a refresh command REF and the like. The command decoder 630 may enable the active command ACT when a combination of the input command signals CMDs indicates the active command ACT, enable the precharge command PRE when the combination of the input command signals CMDs indicates the precharge command PRE, or enable the refresh command REF when the combination of the input command signals CMDs indicates the refresh command REF.

The address counting unit 640 may generate a counting address CTA<0:N>, the value of which is changed whenever the cell array 670 is refreshed. The address counting unit 640 may increase the counting address CTA<0:N> by 1 whenever a first refresh signal REF1 is enabled. The address counting unit 640 may change the counting address CTA<0:N> such that a (K+1)th word line WLK+1 is selected after a Kth normal word line WLK is previously selected.

The address generation unit 650 may invert the part or the LSB IA<N> of the input address IA<0:N> which is inputted through the address input unit 620, and latch the partly inverted input address IA<0:N> in response to the latch signal LAT, and generate the target address OUT2<0:N> in a period where the target refresh signal TR is enabled. The address generation unit 650 may be the same as the address generation circuit described with reference to FIG. 2.

The target address OUT2<0:N> may be the partly inverted input address IA<0:N> outputted from the first latch unit 220, during the first refresh operation in the target refresh period, and may be the added/subtracted address ASA<0:N> during the second refresh operation in the target refresh period. The target address OUT2<0:N> corresponds to a word line adjacent to a word line of the input address IA<0:N>.

For example, when the input address IA<0:N> corresponds to a Kth word line and the LSB thereof is '0', an address latched in response to the latch signal LAT or the partly inverted input address IA<0:N> may have the LSB of '1', and correspond to a (K+1)th normal word line WLK+1. In this case, the added/subtracted address ASA<0:N> may correspond to a (K−1)th normal word line WLK−1. On the other hand, when the input address IA<0:A> corresponds to the Kth normal word line WLK and the LSB thereof is '1', an address latched in response to the latch signal LAT or the partly inverted input address IA<0:N> may have the LSB of '0', and correspond to the (K−1)th normal word line WLK−1. In this case, the added/subtracted address ASA<0:N> may correspond to a (K+1)th normal word line WLK+1.

The control unit 660 may activate a normal word line corresponding to the input address IA<0:N> or a redundancy word line replacing the normal word line in response to the active command ACT, and precharge the activated normal word line in response to the precharge command PRE. The control unit 660 may refresh a normal word line corresponding to the counting address CTA<0:N> or a redundancy word line replacing the normal word line during a normal refresh operation. The control unit 660 may refresh a normal word line or a redundancy word line corresponding to the target address OUT2<0:N> and the third output address OUT3<0:N> during the target refresh operation.

The control unit 660 may refresh a single normal word line or a single redundancy word line in each bank in response to a single application of the refresh command REF. The control unit 660 may enable a first refresh signal REF1 during a normal refresh operation, and enable a second refresh signal REF2 during a target refresh operation, which will be described below with reference to FIG. 7. The control unit 660 may enable the latch signal LAT when the input address IA<0:N> needs to be latched, and enable the target refresh signal TR during the target refresh period. The second refresh signal REF2 described with reference to FIG. 2 may correspond to the second refresh signal REF2 shown in FIG. 6.

Figure 7:
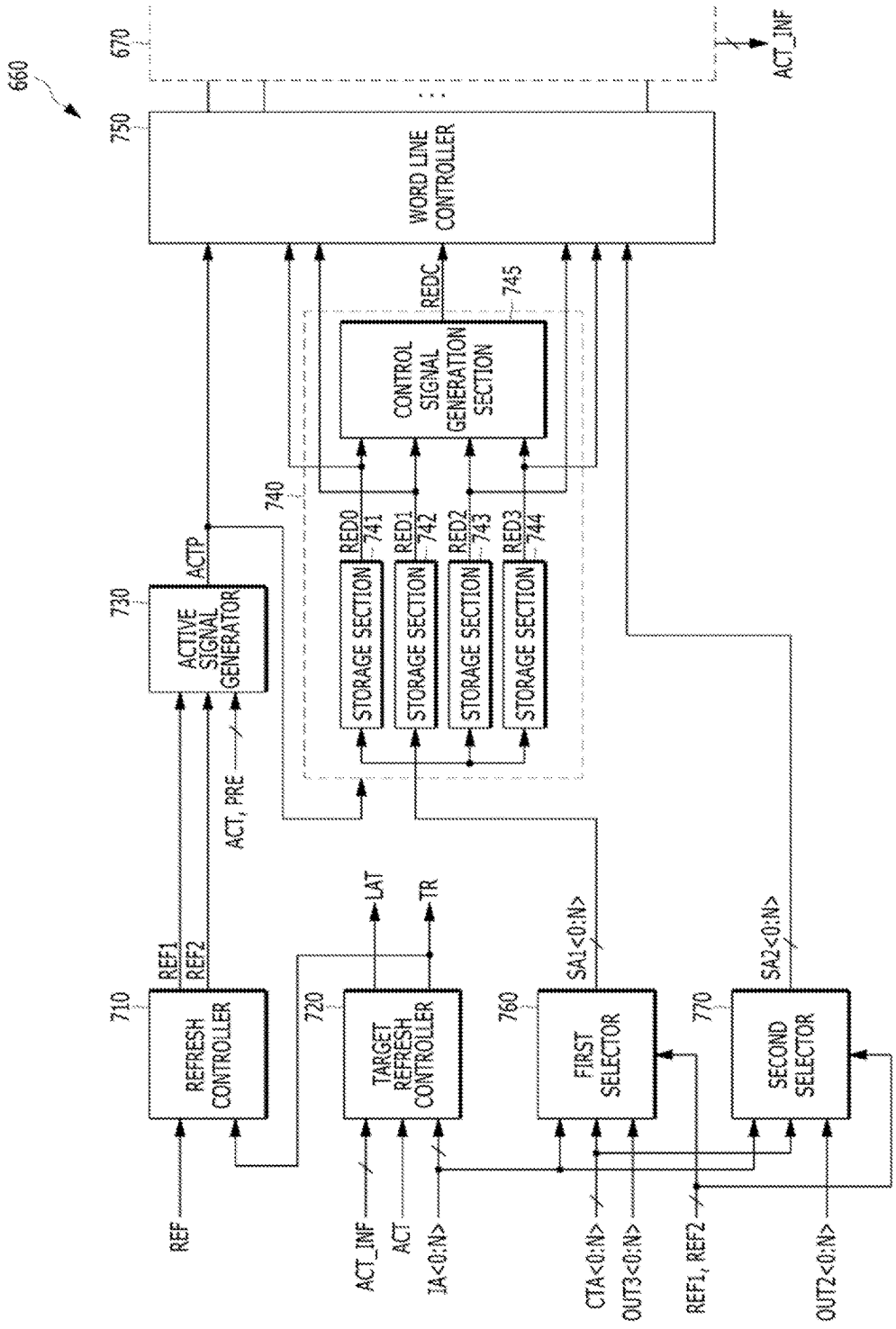
FIG. 7 is a block diagram illustrating a control unit shown in FIG. 6.

FIG. 7 is a block diagram illustrating a control unit shown in FIG. 6.

Referring to FIG. 7, the control unit 660 may include a refresh controller 710, a target refresh controller 720, an active signal generator 730, a redundancy control section 740, a word line control section 750, and first and second selectors 760 and 770.

The refresh controller 710 may enable the first refresh signal REF1 in response to the refresh command REF. The refresh controller 710 may enable the second refresh signal REF2 in response to the refresh command REF when the target refresh signal TR is enabled.

The target refresh controller 720 may generate the latch signal LAT and the target refresh signal TR. The target refresh controller 720 may enable the latch signal LAT when a high active word line is detected. Alternatively, the target refresh controller 720 may periodically or randomly enable the latch signal LAT. The input address IA<0:N> inputted to the first latch unit 220 may correspond to an activated normal word line at the time of the latch operation of the first latch unit 220.

The high active word line may be activated equal to or more than a reference number during a preset period (or time), or the high active word line may be activated with an active frequency equal to or higher than a reference frequency during a preset period (or time). The active frequency may indicate a number of activations of a specific word line during a predetermined number of active operations. The target refresh controller 720 may store an active history indicating the active number of each word line or indicating which word lines have been activated how many times during a predetermined period, and detect the high active word line by referring to the active history. The target refresh controller 720 may directly receive active information ACT_INF from the cell array 670 or receive the active command ACT and the input address IA<0:N> in order to store the active history or the active number of each word line. FIG. 7 illustrates both of the two cases.

The target refresh controller 720 may enable the target refresh signal TR when the high active word line is detected. Alternatively, the target refresh controller 720 may enable the target refresh signal TR when the refresh command REF is inputted a predetermined number of times (for example, four or eight times). The target refresh controller 720 may disable the target refresh signal TR when two refresh operations are completed after the target refresh signal TR is enabled.

The first selector 760 may select one of the input address IA<0:N>, the counting address CTA<0:N>, and the third output address OUT3<0:N>, and output the selected address as an address SA1<0:N>. The first selector 760 may select the input address IA<0:N>, select the counting address CTA<0:N> when the first refresh signal REF1 is enabled, or select the third output address OUT3<0:N> when the second refresh signal REF2 is enabled.

The second selector 770 may select one of the input address IA<0:N>, the counting address CTA<0:N>, and the target output address OUT2<0:N>, and output the selected address as the address SA2<0:N>. The second selector 770 may select the input address IA<0:N>, select the counting address CTA<0:N> when the first refresh signal REF1 is enabled, or select the target address OUT2<0:N> when the second refresh signal REF2 is enabled.

The active signal generator 730 may generate an active signal ACTP in response to the active command ACT and the precharge command PRE. More specifically, the active signal generator 730 may enable the active signal ACTP in response to the active command ACT, and disable the active signal ACTP in response to the precharge command PRE. Alternatively, the active signal generator 730 may enable the active signal ACTP during a predetermined period in response to the refresh signals REF1 and REF2. The predetermined period may correspond to a time required for refreshing a selected word line (a normal or redundancy word line) or a time required for activating the selected word line, amplifying data, and precharging the activated word line.

When the active signal ACTP is enabled, the redundancy control section 740 may receive the address SA1<0:N> selected through the first selector 760 and control the redundancy operation of the memory device. The redundancy operation of the memory device may indicate an operation of replacing a normal word line with a redundancy word line. That is, the redundancy operation may indicate an operation of accessing (activating and refreshing) a redundancy word line replacing a normal word line.

The redundancy control section 740 may include a plurality of storage sections 741 to 744 and a control signal generation section 745. The plurality of storage sections 741 to 744 may generate redundancy signals RED0 to RED3 for controlling the corresponding redundancy word line groups RWG0 to RWG3. The control signal generation section 745 may generate a redundancy control signal REDC which is enabled when the redundancy operation is performed.

Each of the plurality of storage sections 741 to 744 may compare the address SA1<0:N> to addresses stored therein, and enable a corresponding one of the redundancy signals RED0 to RED3 when the address SA1<0:N> is equal to the addresses stored therein. The control signal generation section 735 may enable the redundancy control signal REDC when one or more of the redundancy signals RED0 to RED3 are enabled.

The word line control section 750 may select and access one of the plurality of normal word lines WL0 to WLM and the plurality of redundancy word lines RWL0 to RWL7 in response to the address SA2<0:N> selected through the second selector 770, the redundancy signals RED0 to RED3, and the redundancy control signal REDC. The word line control section 750 may activate the selected word line when the active signal ACTP is enabled, and precharge the selected word line when the active signal ACTP is disabled.

The word line control section 750 may select a normal word line corresponding to the address SA2<0:N> when the redundancy control signal REDC is disabled. The word line control section 750 may select a redundancy word line in response to the enabled one of the redundancy signals RED0 to RED3 and the LSB SA2<N> of the address SA2<0:N> output from the second selector 770 when the redundancy control signal REDC is enabled. For example, when the redundancy signal RED2 is enabled and the LSB SA2<N> is '0', the word line control section 750 may select the first redundancy word line RWL4 of the redundancy word line group RWG2.

The word line control section 750 may refresh a redundancy word line corresponding to the enabled redundancy signal and the LSB SA2<N> when the redundancy control signal REDC is enabled during the first refresh operation in the target refresh period. Furthermore, the word line control section 750 may refresh a redundancy word line corresponding to the next redundancy signal of the enabled redundancy signal and the LSB SA2<N>, when the LSB SA2<N> is 0, during the second refresh operation in the target refresh period. The word line control section 750 may refresh a redundancy word line corresponding to the previous redundancy word line of the enabled redundancy signal and the LSB SA2<N>, when the LSB SA2<N> is 1, during the second refresh operation in the target refresh period.

In the redundancy operation during the target refresh period, the enabled redundancy signal, which corresponds to the partly inverted input address IA<0:N> outputted from the first latch unit 220, may represent a high active redundancy word line corresponding to the input address IA<0:N> since the input address IA<0:N> and the partly inverted input address IA<0:N> are the same as each other except for a single bit or the LSB IA<N> and thus the word lines of the input address IA<0:N> and the partly inverted input address IA<0:N> correspond to the same redundancy word line. Further, in the redundancy operation during the target refresh period, the combination of the enabled redundancy signal with the LSB SA2<N> of the address SA2<0:N>, which corresponds to the second output address or the target address OUT2<0:N>, may represent one of a pair of neighboring redundancy word lines to the high active redundancy word line. As described above, the second output address or the target address OUT2<0:N> may be the partly inverted input address IA<0:N> outputted from the first latch unit 220, during the first refresh operation in the target refresh period. The next or previous redundancy signal may correspond to the other one of the pair of neighboring redundancy word lines to the high active redundancy word line.

For example, when the redundancy signal RED1 is enabled during the first refresh operation in the target refresh period and the LSB SA2<N> is 0, the word line control section 750 may refresh the redundancy word line RWL2 of the redundancy word line group RWG1. Next, when the redundancy signal RED1 is enabled during the second refresh operation in the target refresh period and the LSB SA2<N> is 0, the word line control section 750 may refresh the redundancy word line RWL4 of the redundancy word line group RWG2. In this exemplary case, the redundancy signal RED1 with the LSB SA2<N> of '0' may correspond to one of a pair of neighboring redundancy word lines to the high active redundancy word line, that is, the redundancy word line RWL2 of the redundancy word line group RWG1. The redundancy word line RWL4 of the redundancy word line group RWG2 may be the other one of the pair of neighboring redundancy word lines to the high active redundancy word line.

For another example, when the redundancy signal RED1 is enabled during the first refresh operation in the target refresh period and the LSB SA2<N> is 1, the word line control section 750 may refresh the redundancy word line RWL3 of the redundancy word line group RWG1. When the redundancy signal RED1 is enabled during the second refresh operation in the target refresh period and the LSB SA2<N> is 1, the word line control section 750 may refresh the redundancy word line RWL1 of the redundancy word line group RWG0. In such case, the redundancy signal RED1 with the LSB SA2<N> of '1' may correspond to one of a pair of neighboring redundancy word lines to the high active redundancy word line, that is, the redundancy word line RWL3 of the redundancy word line group RWG1. The redundancy word line RWL1 of the redundancy word line group RWG0 may be the other one of the pair of neighboring redundancy word lines to the high active redundancy word line.

Figure 8:
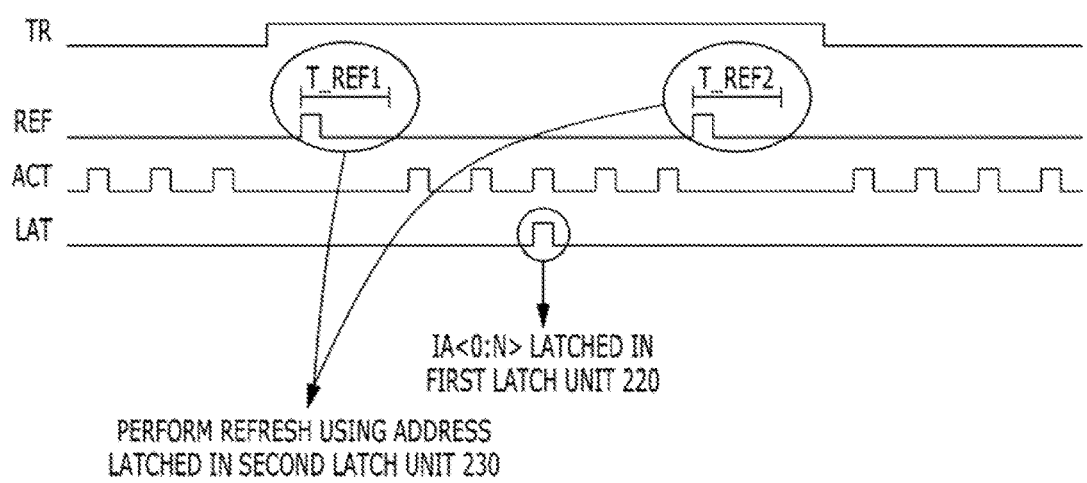
FIG. 8 is a timing diagram illustrating an operation of a memory device shown in FIG. 6.

FIG. 8 is a timing diagram illustrating an operation of a memory device shown in FIG. 6. FIG. 8 shows a waveform of the commands inputted to the memory device and the target refresh operation of the memory device.

Referring to FIG. 8, the memory device may enter the target refresh period when the target refresh signal TR is enabled, and refresh a word line selected through the target address OUT2<0:N> when the refresh command REF is inputted during the target refresh period. During the target refresh period, two word lines may be refreshed. For example, when the latch signal LAT is enabled and the address of a Kth normal word line WLK is latched, a (K−1)th word line and a (K+1)th word line may be refreshed during the target refresh period. For reference, the word lines may be refreshed in the order of WLK−1 and WLK+1 or WLK+1 and WLK−1 according to the LSB of the address of the Kth word line.

Between first and second refresh operations T_REF1 and T_REF2, the active command ACT and the latch signal LAT may be enabled. The first latch 220 of the address generation unit 650 may latch the input address IA<0:N> regardless of the target refresh operation while the second latch 230 may maintain a value latched in the target refresh period, thereby latching an address for the next target refresh operation during the current target refresh period.

Figure 9:
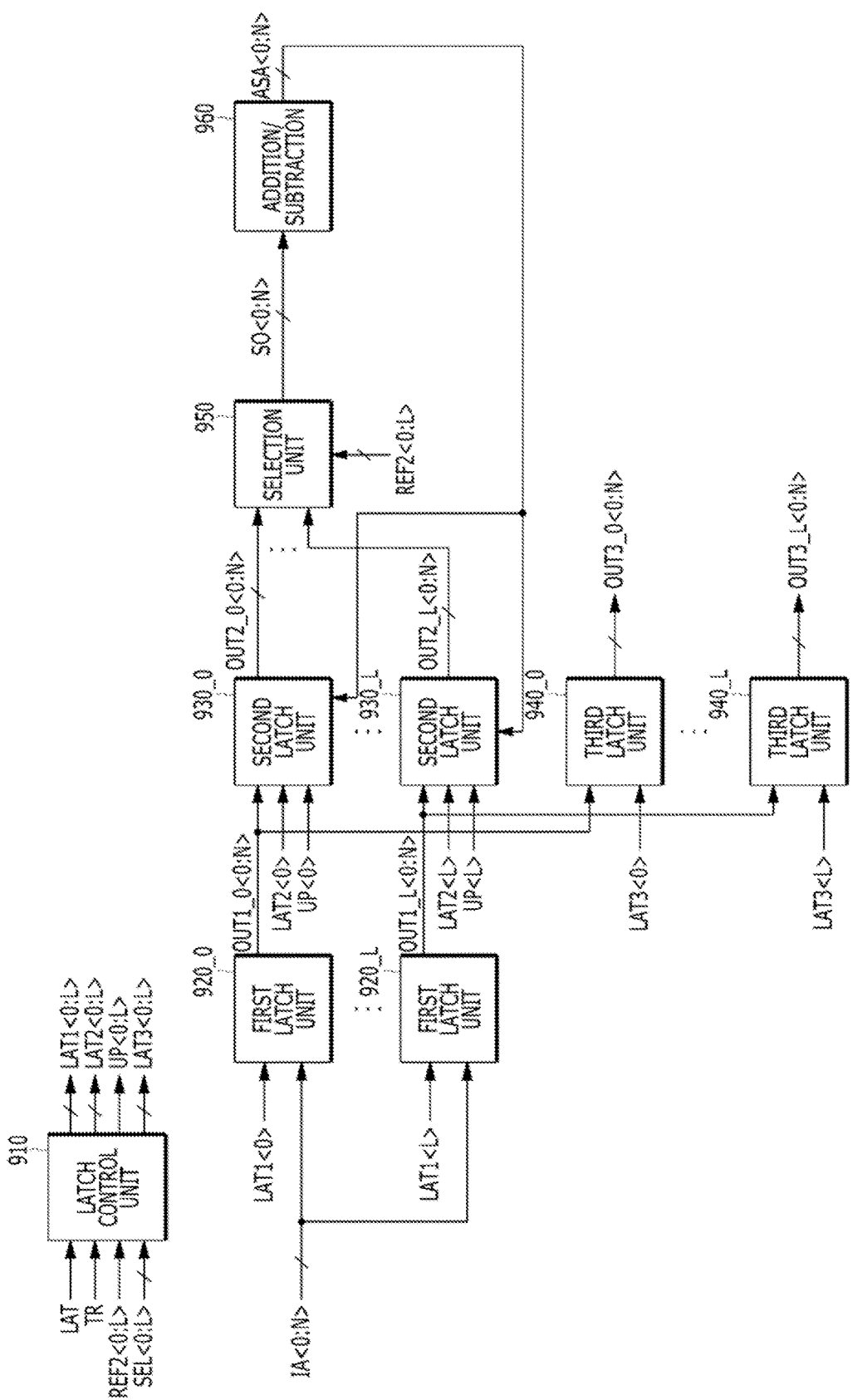
FIG. 9 is a block diagram illustrating an address generation circuit in accordance with an embodiment of the present invention.

FIG. 9 is a block diagram illustrating an address generation circuit in accordance with an embodiment of the present invention.

Referring to FIG. 9, the address generation circuit may include a latch control unit 910, a plurality of first latch units 920_0 to 920_L, a plurality of second latch units 930_0 to 930_L, a plurality of third latch units 940_0 to 940_L, a selection unit 950, and an addition/subtraction unit 960.

The latch control unit 910 may generate signals LAT1<0:L>, LAT2<0:L>, LAT3<0:L>, and UP<0:L> for controlling the plurality of first to third latch units 920_0 to 920_L, 930_0 to 930_L, and 940_0 to 940_L. The latch control unit 910 may enable a first control signal corresponding to an enabled select signal among the first control signals LAT1<0:L> when a latch signal LAT is enabled. The latch control unit 910 may maintain the second and third control signals LAT2<0:L> and LAT3<0:L> enabled, and disable the second and third control signals LAT2<0:L> and LAT3<0:L> in a period where a target refresh signal TR is enabled. The latch control unit 910 may sequentially enable the update signals UP<0:L> in response to select signals REF2<0:L> after a second refresh signal REF2<L> is enabled for the first time in the period where the target refresh signal TR is enabled.

The first latch units 920_0 to 920_L may invert a part of an input address IA<0:N>, for example, a least significant bit (LSB) IA<N> of the input address IA<0:N>, latch the partly inverted input address IA<0:N>, and output the latched address as first output addresses OUT1_0<0:N> to OUT1_L<0:N>, respectively, when the corresponding first control signals LAT1<0:N> are enabled.

The second latch units 930_0 to 930L may receive the corresponding first output addresses OUT1_0<0:N> to OUT1_L<0:N> and latch and output the received addresses, in a period where the corresponding second control signals LAT2<0:L> are enabled. The second latch units 930_0 to 930_L may maintain the latched values therein without reception of the first output addresses OUT1_0<0:N> to OUT1_L<0:N> in a period where the corresponding second control signals LAT2<0:L> are disabled. The second latch units 930_0 to 930_L may receive and latch an added/subtracted address ASA<0:N> outputted from the addition/subtraction unit 960 when the corresponding update signals UP<0:L> are enabled.

The third latch units 940_0 to 940_N may receive the corresponding first output addresses OUT1_0<0:N> to OUT1_L<0:N> and latch and output the received addresses, in a period where the corresponding third control signals LAT3<0:L> are enabled. The third latch units 940_0 to 940_L may maintain the latched values without reception of the first output addresses OUT1_0<0:N> to OUT1_L<0:N> in a period where the corresponding third control signals LAT3<0:L> are disabled.

Each of the first latch units 920_0 to 920_L of FIG. 9 may be the same as the first latch unit 220 described above with reference to FIG. 3, each of the second latch units 930_0 to 930_L may be the same as the second latch unit 230 described above with reference to FIG. 4, and each of the third latch units 940_0 to 940_L may be the same as the third latch unit 240 described above with reference to FIG. 5.

The selection unit 950 may select and output one of the second output addresses OUT2_0<0:N> to OUT2_L<0:N> as a selected second output address SO<0:N> in response to the plurality of select signals REF2<0:L>. The selection unit 950 may sequentially select the second output addresses OUT2_0<0:N> to OUT2_L<0:N> corresponding to the select signals REF2<0:L>, and output the selected second output address SO<0:N>.

The addition/subtraction unit 960 may receive the selected second output address OS<0:N>, and add/subtract a predetermined value to or from the second output address OUT2<0:N> to generate the added/subtracted address ASA<0:N>. When a part of the selected second output address OS<0:N> (for example, the LSB OS<N>) has a first value (for example, '0'), the addition/subtraction unit 960 may add the predetermined value (for example, '2') to the selected second output address OS<0:N>. When the part of the selected second output address OS<0:N> has a second value (for example, '1'), the addition/subtraction unit 250 may subtract the predetermined value from the selected second output address OS<0:N>.

Each of the second output addresses OUT2_0<0:N> to OUT2_L<0:N> may be a target address for selecting a word line of the corresponding bank during a target refresh operation in the memory device. Each of the third output addresses OUT3_0<0:N> to OUT3_L<0:N> may be used for controlling a redundancy operation of the corresponding bank in the memory device. Each of the second output addresses OUT2_0<0:N> to OUT2_L<0:N> may be the partly inverted input address IA<0:N> of the corresponding bank during the first refresh operation in the target refresh period, and may be the added/subtracted address ASA<0:N> during the second refresh operation in the target refresh period.

Figure 10:
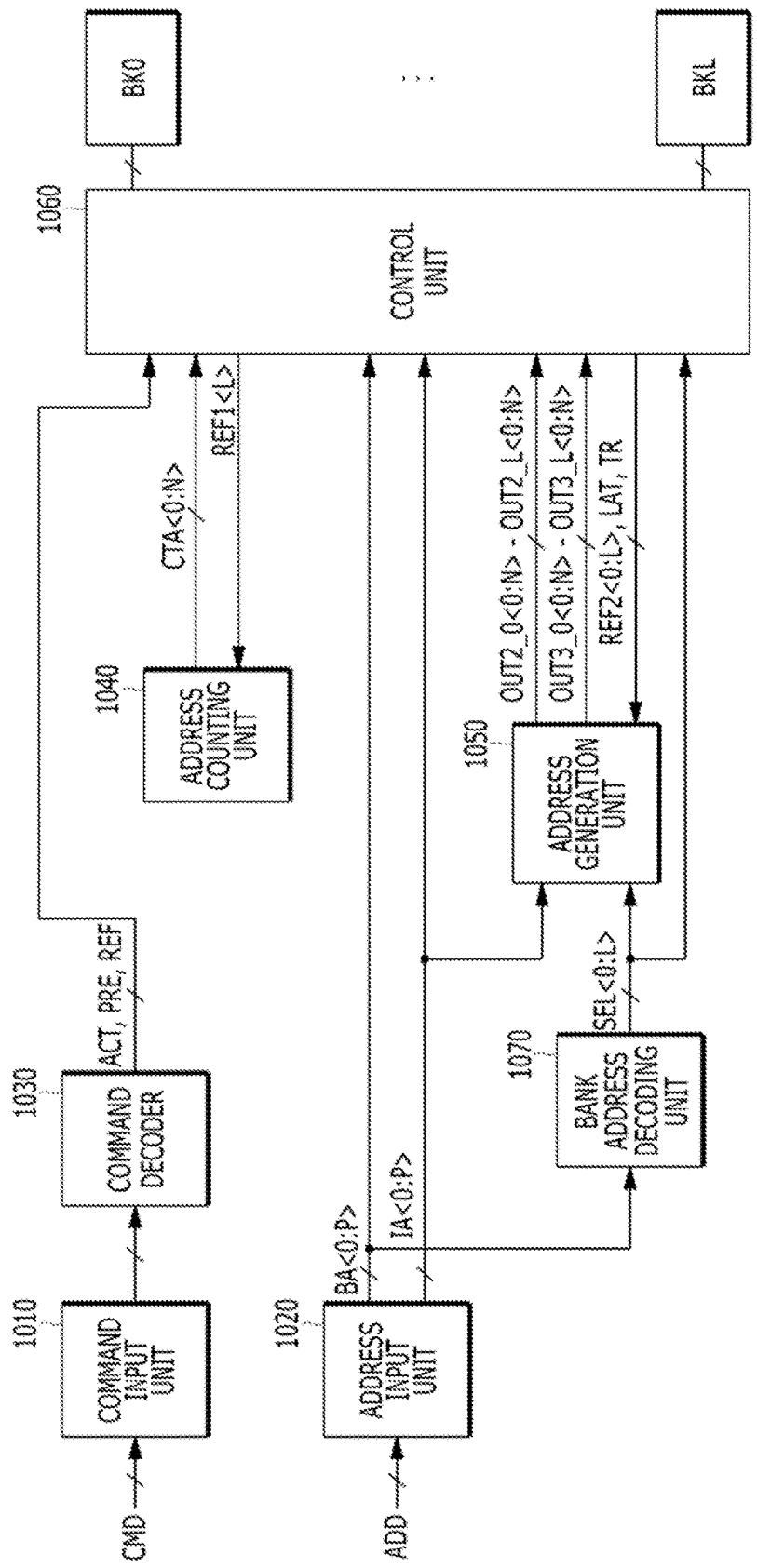
FIG. 10 is a block diagram illustrating a memory device in accordance with an embodiment of the present invention.

FIG. 10 is a block diagram illustrating a memory device in accordance with an embodiment of the present invention.

Referring to FIG. 10, the memory device may include a command input unit 1010, an address input unit 1020, a command decoder 1030, an address counting unit 1040, an address generation unit 1050, a control unit 1060, a bank address decoding unit 1070, and a plurality of banks BK0 to BKL. Each of the banks BK0 to BKL may correspond to the cell array 670 of FIG. 6.

Referring to FIGS. 9 and 10, the command input unit 1010, the address input unit 1020, the command decoder 1030, and the address counting unit 1040 may be the same as the command input unit 610, the address input unit 620, the command decoder 630, the address counting unit 640 described above with reference to FIG. 6.

The address input unit 1020 may further transfer a bank address BA<0:P> for selecting one or more banks among the plurality of banks BK0 to BKL to the control unit 1060 and the bank address decoding unit 1070. Furthermore, the address counting unit 1040 may increase the value of the counting address CTA<0:N> by 1 whenever the first refresh signal REF1<L>, which is finally enabled among the plurality of first refresh signals REF1<0:L>, is enabled.

The first to third latch units 920_0 to 920_L, 930_0 to 930_L, and 940_0 to 940_L of FIG. 9 may correspond to the plurality of banks BK0 to BKL, respectively, and latch and generate an address required for operation of the corresponding bank.

The bank address decoding unit 1070 may decode the bank address BA<0:P> and generate select signals SEL<0:L>. The select signals SEL<0:L> may correspond to the select signals SEL<0:L> described above with reference to FIG. 9.

The address generation unit 1050 may invert the part or the LSB IA<N> of the input address IA<0:N>, and latch the partly inverted input address IA<0:N> through a selected one among the first latch units 920_0 to 920_L in response to the latch signal LAT in a period where the target refresh signal TR is enabled. The address generation unit 1050 may be the same as the address generation circuit described with reference to FIG. 9.

The address generation unit 1050 may sequentially output target addresses OUT2_0<0:N> to OUT2_L<0:N> corresponding to the respective banks BK0 to BKL in response to a plurality of second refresh signals REF2<0:L> which are sequentially enabled. For example, the target address OUT2_1<0:N> outputted when the second refresh signal REF2<1> is enabled may be the target address for the bank BK1. Each of the target addresses OUT2_0<0:N> to OUT2_L<0:N> may correspond to one of the pair of neighboring normal word lines, for example, a (K−1)th normal word line WLK−1 and a (K+1)th normal word line WLK+1, when the input address IA<0:N> inputted to the first latch unit of each bank corresponds to the high active word line, for example, a Kth normal word line WLK.

The control unit 1060 may activate a normal word line corresponding to the input address IA<0:N> of the bank selected through the bank address BA<0:P> or a redundancy word line replacing the normal word line in response to the active command ACT, and precharge the activated normal word line in response to a precharge command PRE. The control unit 1060 may refresh a normal word line corresponding to the counting address CTA<0:N> or a redundancy word line replacing the normal word line in each bank during a normal refresh operation. The control unit 1060 may sequentially refresh the normal word lines or redundancy word lines which are selected through the corresponding target addresses OUT2_0<0:N> to OUT2_L<0:N> and the corresponding third output addresses OUT3_0<0:N> to OUT3_L<0:N> in the respective banks, during the target refresh operation.

The sequential refresh operation to the word lines may indicate that the word lines in each bank are activated and precharged during a predetermined time and the activation and precharge are sequentially performed by the unit of the single bank.

The control unit 1060 may refresh a single normal word line or a single redundancy word line in each bank in response to a single application of the refresh command REF. The control unit 1060 may sequentially enable the first refresh signals REF1<0:L> during a normal refresh operation, and sequentially enable the second refresh signals REF2<0:L> during the target refresh operation, which will be described below with reference to FIG. 11.

The control unit 1060 may enable the latch signal LAT when the input address IA<0:N> needs to be latched, and enable the target refresh signal TR during the target refresh period. The second refresh signal REF2<L> described with reference to FIG. 9 may correspond to the second refresh signal REF2<L> shown in FIG. 10, and the select signals REF2<0:L> described with reference to FIG. 9 may correspond to the second refresh signals REF2<0:L> shown in FIG. 10, respectively.

Figure 11:
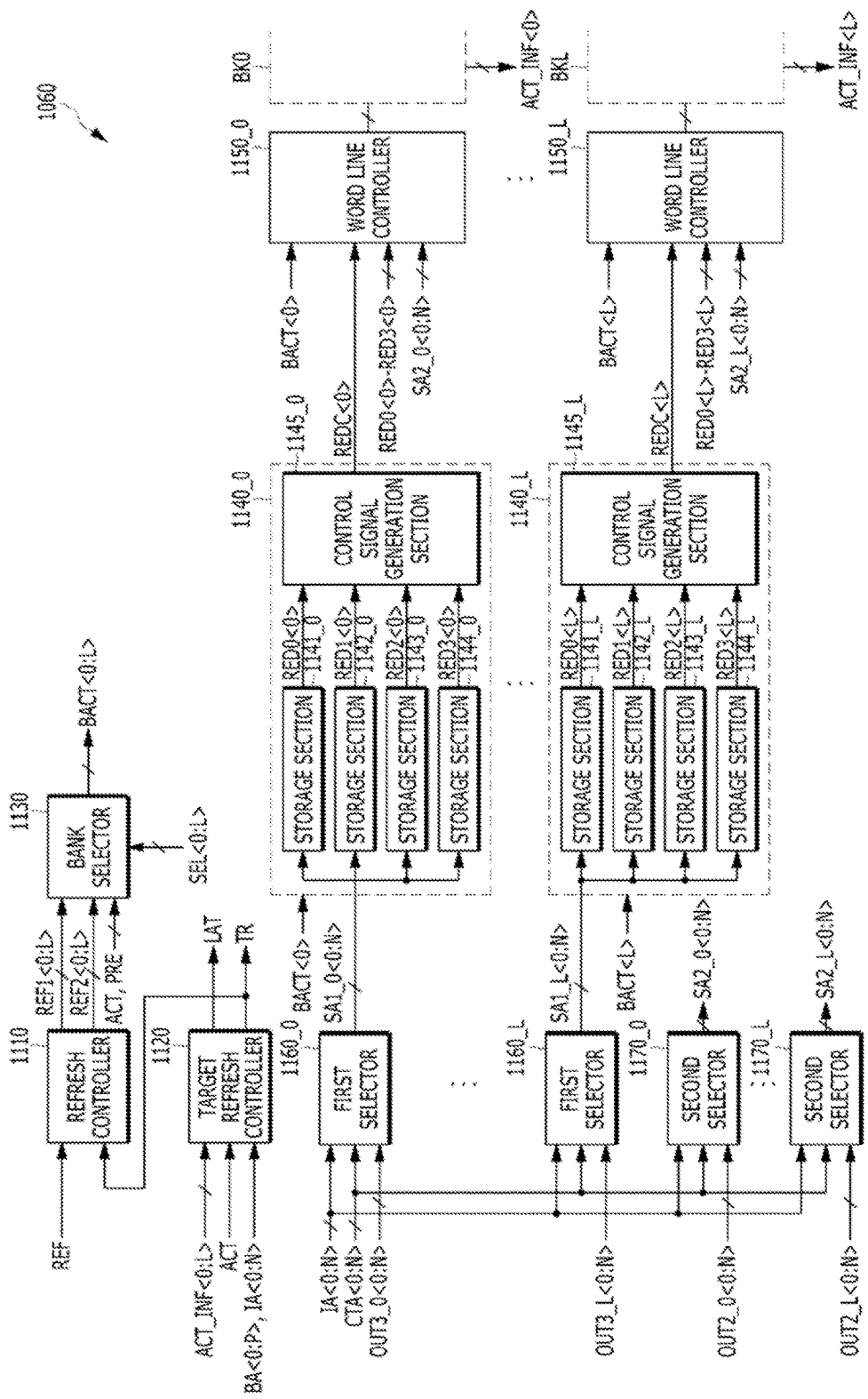
FIG. 11 is a block diagram illustrating a control unit shown in FIG. 10.

FIG. 11 is a block diagram illustrating the control unit 1060 shown in FIG. 10.

Referring to FIG. 11, the control unit 1060 may include a refresh controller 1110, a target refresh controller 1120, a bank selector 1130, a plurality of redundancy control sections 1140_0 to 1140_L, a plurality of word line control sections 1150_0 to 1150_L, a plurality of first selectors 1160_0 to 1160_L, and a plurality of second selectors 1170_0 to 1170_L.

The refresh controller 1110 may sequentially enable the plurality of first refresh signals REF1_0 to REF1_L in response to the refresh command REF. When the target refresh signal TR is enabled, the refresh controller 1110 may sequentially enable the plurality of second refresh signals REF2_0 to REF2_L in response to the refresh command REF.

The target refresh controller 1120 may be the same as the target refresh controller 720 described with reference to FIG. 7.

Each of the plurality of first selectors 1160_0 to 1160_L and each of the plurality of second selectors 1170_0 to 1170_L may be the same as the first selector 760 and the second selector 770, respectively.

The plurality of first selectors 1160_0 to 1160_L may select one of the input address IA<0:N>, the counting address CTA<0:N>, and the third output addresses OUT3_0<0:N> to OUT3_L<0:N> as selected addresses SA1_0<0:N> to SA1_L<0:N>. The plurality of first selectors 1160_0 to 1160_L may select the input address IA<0:N>, select the counting address CTA<0:N> when the corresponding first refresh signals REF1<0:L> are enabled, or select the corresponding third output addresses OUT3_0<0:N> to OUT3_L<0:N> when the corresponding second refresh signals REF2<0:L> are enabled.

The plurality of second selectors 1170_0 to 1170_L may select one of the input address IA<0:N>, the counting address CTA<0:N>, and target addresses TA_0<0:N> to TA_L<0:N> as selected addresses SA2_0<0:N> to SA2_L<0:N>. The plurality of second selectors 1170_0 to 1170_L may select the input address IA<0:N>, select the counting address CTA<0:N> when the corresponding first refresh signals REF1<0:L> are enabled, or select the corresponding target addresses OUT2_0<0:N> to OUT2_L<0:N> when the corresponding second refresh signals REF2<0:L> are enabled.

The bank selector 1130 may generate a plurality of bank active signals BACT<0:L> in response to the active command ACT, the precharge command PRE, and the select signals SEL<0:L>. More specifically, the bank selector 1130 may enable the bank active signals BACT<0:L> selected through the select signals SEL<0:L> in response to the active command ACT, and disable the enabled bank active signals BACT<0:L> in response to the precharge command PRE. Furthermore, the bank selector 1130 may enable the bank active signals BACT<0:L> during a predetermined period in response to the plurality of refresh signals REF1<0:L> and REF2<0:L>. Each of the bank active signals BACT<0:L> may correspond to one of the plurality of banks BK0 to BKL.

Each of the plurality of redundancy control sections 1140_0 to 1140_L may be the same as the redundancy control section 740 described with reference to FIG. 7.

The plurality of redundancy control sections 1140_0 to 1140_L may correspond to the plurality of banks BK0 to BKL, respectively. When the corresponding bank active signals BACT<0:L> are enabled, the plurality of redundancy control sections 1140_0 to 1140_L may receive addresses SA1_0<0:N> to SA1_L<0:N> selected through the corresponding first selectors 1160_0 to 1160_L, and control redundancy operations for the selected banks.

The plurality of redundancy control sections 1140_0 to 1140_L may include a plurality of storage sections 1141_0 to 1144_L and control signal generation sections 1145_0 to 1145_L, respectively. The plurality of storage sections 1141_0 to 1144_L may generate redundancy signals RED0<0:L> to RED3<0:L> for controlling the redundancy word line groups RWG0 to RWG3 of the corresponding banks. The control signal generation sections 1145_0 to 1145_L may generate redundancy control signals REDC<0:L> which are enabled when a redundancy operation is performed in the corresponding banks. The storage sections 1141_0 to 1144_L may compare outputs SA1_0<0:N> to SA1_L<0:N> of the corresponding first selectors to addresses stored therein when the corresponding bank active signals BACT<0:L> are enabled, and enable the corresponding redundancy signals when the outputs SA1_0<0:N> to SA1_L<0:N> are equal to the address stored therein. The control signal generation sections 1145_0 to 1145_L may enable the corresponding redundancy control signals REDC<0:L> when one or more redundancy signals of the corresponding redundancy signals RED0<0:L> to RED3<0:L> are enabled.

Each of the plurality of word line control sections 1150_0 to 1150_L may be the same as the word line control section 750 described with reference to FIG. 7.

The plurality of word line control sections 1150_0 to 1150_L may select and access one of the plurality of normal word lines WL0 to WLM and the plurality of redundancy word lines RWL0 to RWL7 in response to the addresses SA2_0<0:N> to SA2_L<0:N> selected through the corresponding second selectors, the corresponding redundancy signals RED0<0:L> to RED3<0:L>, and the corresponding redundancy word lines REDC<0:L>. The word line control sections 1150_0 to 1150_L may activate the selected word line when the corresponding bank active signals BACT<0:L> are enabled, and precharge the activated word line when the corresponding bank active signals BACT<0:L> are disabled.

The word line control sections 1150_0 to 1150_L may select normal word lines corresponding to the addresses SA2_0<0:N> to SA2_L<0:N> selected through the corresponding second selectors when the corresponding redundancy control signals REDC<0:L> are disabled. The word line control sections 1150_0 to 1150_L may select redundancy word lines in response to the enabled redundancy signals and the corresponding LSBs SA2_0<N> to SA2_L<N> of the addresses SA2_0<0:N> to SA2_L<0:N> when the corresponding redundancy control signals REDC<0:L> are enabled. For example, when the bank active signal BACT<0> is enabled, the redundancy signal RED2<0> is enabled, and the LSB SA2_0<N> is 0, the word line control section 1150_0 may select the redundancy word line RWL4 of the redundancy word line group RWG2 of the bank BK0.

The word line control sections 1150_0 to 1150_L may refresh a redundancy word line corresponding to the enabled redundancy signal among the corresponding redundancy signals and the corresponding LSBs SA2_0<N> to SA2_L<N> when a corresponding one of the corresponding redundancy signals RED0<0:L> to RED3<0:L> is enabled during the first refresh operation in the target refresh period. Furthermore, the word line control sections 1150_0 to 1150_L may refresh a redundancy word line corresponding to the next redundancy signal of the enabled redundancy signal and the LSB SA2<N> when the corresponding LSBs SA2_0<N> to SA2_L<N> are '0', during the second refresh operation in the target refresh period. Furthermore, the word line control sections 1150_0 to 1150_L may refresh a redundancy word line corresponding to the previous redundancy signal of the enabled redundancy signal and the LSB SA2<N> when the LSBs SA2_0<N> to SA2_L<N> are '1', during the second refresh operation in the target refresh period.

Figure 12:
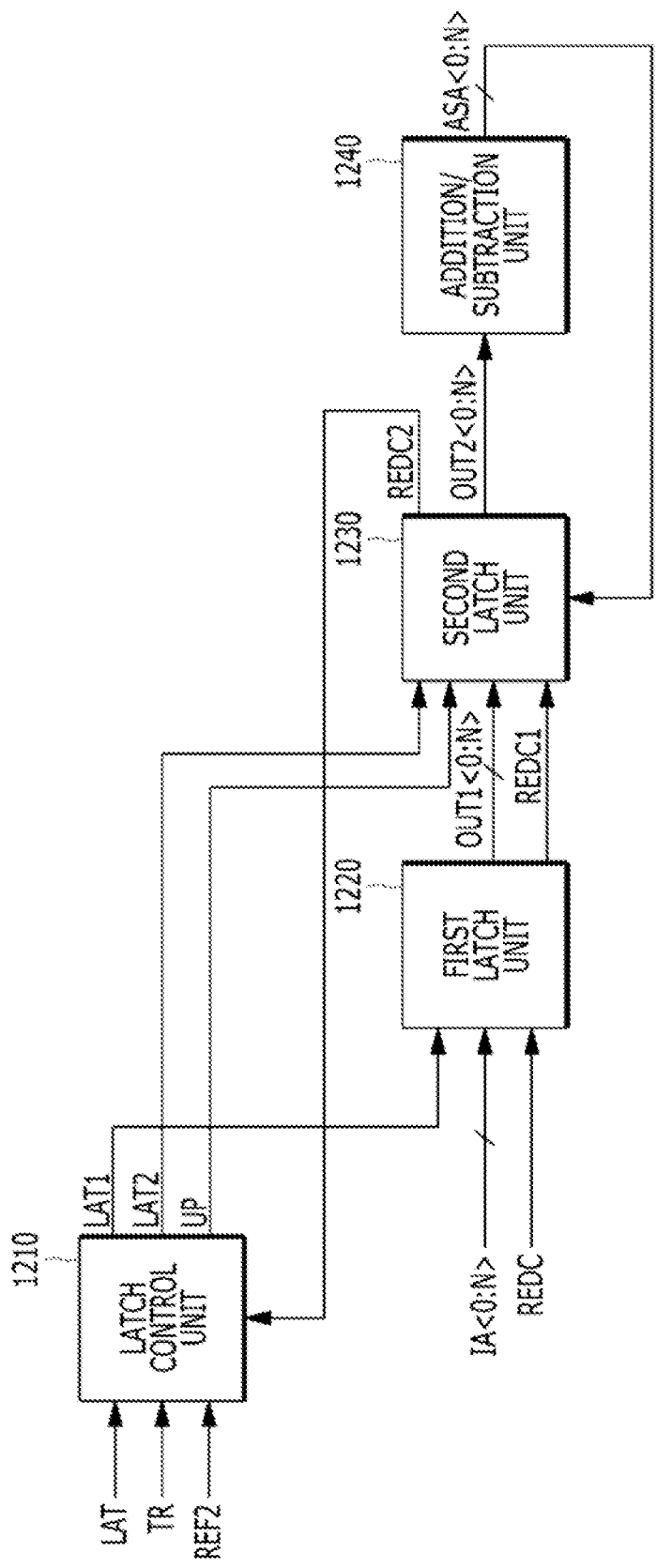
FIG. 12 is a block diagram illustrating an address generation circuit in accordance with an embodiment of the present invention.

FIG. 12 is a block diagram Illustrating an address generation circuit in accordance with an embodiment of the present invention.

Referring to FIG. 12, the address generation circuit may include a latch control unit 1210, a first latch unit 1220, a second latch unit 1230, and an addition/subtraction unit 1240.

The address generation circuit of FIG. 12 may additionally latch a redundancy control signal REDC, unlike the address generation circuit described with reference to FIG. 2. The redundancy control signal REDC may be enabled when a word line corresponding to the input address IA<0:N> is replaced with a redundancy word line, and may be disabled when the word line corresponding to the input address IA<0:N> is not replaced with a redundancy word line. Using the latched redundancy control signal REDC during the second refresh operation of the target refresh period, the address generation circuit may update the value of the target address OUT2<0:N> to the addition/subtraction ASA<0:N> or maintain the target address OUT2<0:N> to the partly inverted input address IA<0:N>, which is the same as the input address IA<0:N> except for the LSB IA<N>.

In the address generation circuit of FIG. 12, the first and second latch units 1220 and 1230 may additionally latch the redundancy control signal REDC, and determine whether to update the target address OUT2<0:N> of the second latch unit 1230 to the addition/subtraction ASA<0:N> based on the latched redundancy control signal REDC. Thus, the address generation circuit does not need the third latch unit 240 unlike the address generation circuit described with reference to FIG. 2. Therefore, the address generation circuit may reduce the circuit area while supporting the same operations as the address generation circuit described with reference to FIG. 2.

The latch control unit 1210 may generate signals LAT1, LAT2, and UP for controlling the first and second latch units 1210 and 1220. The latch control unit 1210 may enable the first control signal LAT1 when a latch signal LAT is enabled. The latch control unit 1210 may maintain the second control signal LAT2 enabled, and disable the second control signal LAT2 in a period where a target refresh signal TR is enabled.

The latch control unit 1210 may enable the update signal UP when a redundancy control signal REDC2 is disabled after a second refresh signal REF2 is enabled for the first time in a period where the target refresh signal TR is enabled, and disable the update signal UP when the redundancy control signal REDC2 is enabled.

When the first control signal LAT1 is enabled, the first latch unit 1220 may invert a part of the input address IA<0:N>, for example, a least significant bit (LSB) IA<N> of the input address IA<0:N>, latch the partly inverted input address IA<0:N> and a redundancy control signal REDC corresponding to the input address IA<0:N>, and output the latched address and the redundancy control signal REDC as a first output address OUT1<0:N> and a redundancy control signal REDC1.

The second latch unit 1230 may receive the first output address OUT1<0:N> and the redundancy control signal REDC1, latch the received address and the redundancy control signal REDC1, and output the latched address and the redundancy control signal REDC1 as a second output address OUT2<0:N> and the redundancy control signal REDC2 in a period when the second control signal LAT2 is enabled. The second latch unit 1230 may maintain the latched values therein without reception of the above-described signals OUT1<0:N> and REDC1 in a period in which the second control signal LAT2 is disabled. The second latch unit 1230 may receive and latch an added/subtracted address ASA<0:N> outputted from the addition/subtraction unit 1240 when the update signal UP is enabled.

The addition/subtraction unit 1240 may be the same as the addition/subtraction unit 250 described with reference to FIG. 2.

The second output address OUT2<0:N> may be the target address for a word line during the target refresh operation in the memory device, and an address for controlling the redundancy operation of the memory device. The second output address OUT2<0:N> may be the partly inverted input address IA<0:N> during the first refresh operation in the target refresh period. Furthermore, the second output address OUT2<0:N> may be the added/subtracted address ASA<0:N> when the memory device does not perform the redundancy operation during a second refresh operation in the target refresh period, and may be the partly inverted input address IA<0:N> when the memory device performs the redundancy operation.

In other words, during the first refresh operation of the target refresh period, the second output address or the target address OUT2<0:N> may be the partly inverted input address IA<0:N>. Furthermore, during the second refresh operation in the target refresh period, the target address OUT2<0:N> may be the added/subtracted address ASA<0:N> when the latched redundancy control signal REDC2 is disabled, and may be the partly inverted input address IA<0:N> when the latched redundancy control signal REDC2 is enabled.

Figure 13:
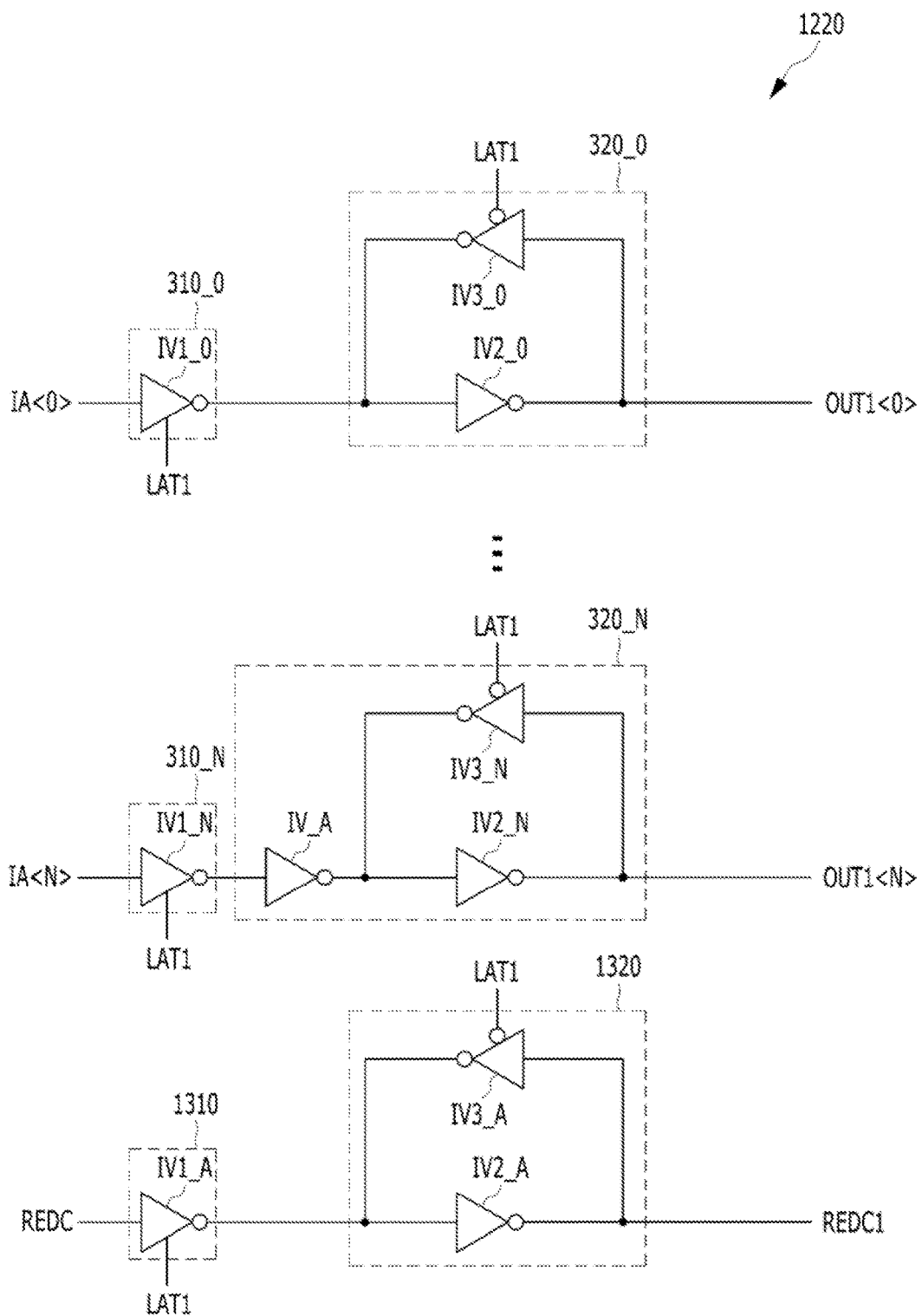
FIG. 13 is a circuit diagram illustrating a first latch unit shown in FIG. 12.

FIG. 13 is a circuit diagram illustrating the first latch unit 1220 shown in FIG. 12.

Referring to FIG. 13, the first latch unit 1220 may further include an input unit 1310 and a latch 1320 corresponding to the redundancy control signal REDC in addition to the configuration of the first latch unit 220 of FIG. 3.

The first input unit 1310 and the latch 1320 may have the same configuration as the input units 310_0 to 310_N and the latches 320_0 to 320_N which have been described with reference to FIG. 3, except that the first input unit 1310 and the latch 1320 receive the redundancy control signal REDC and latch and output the received signal.

Figure 14:
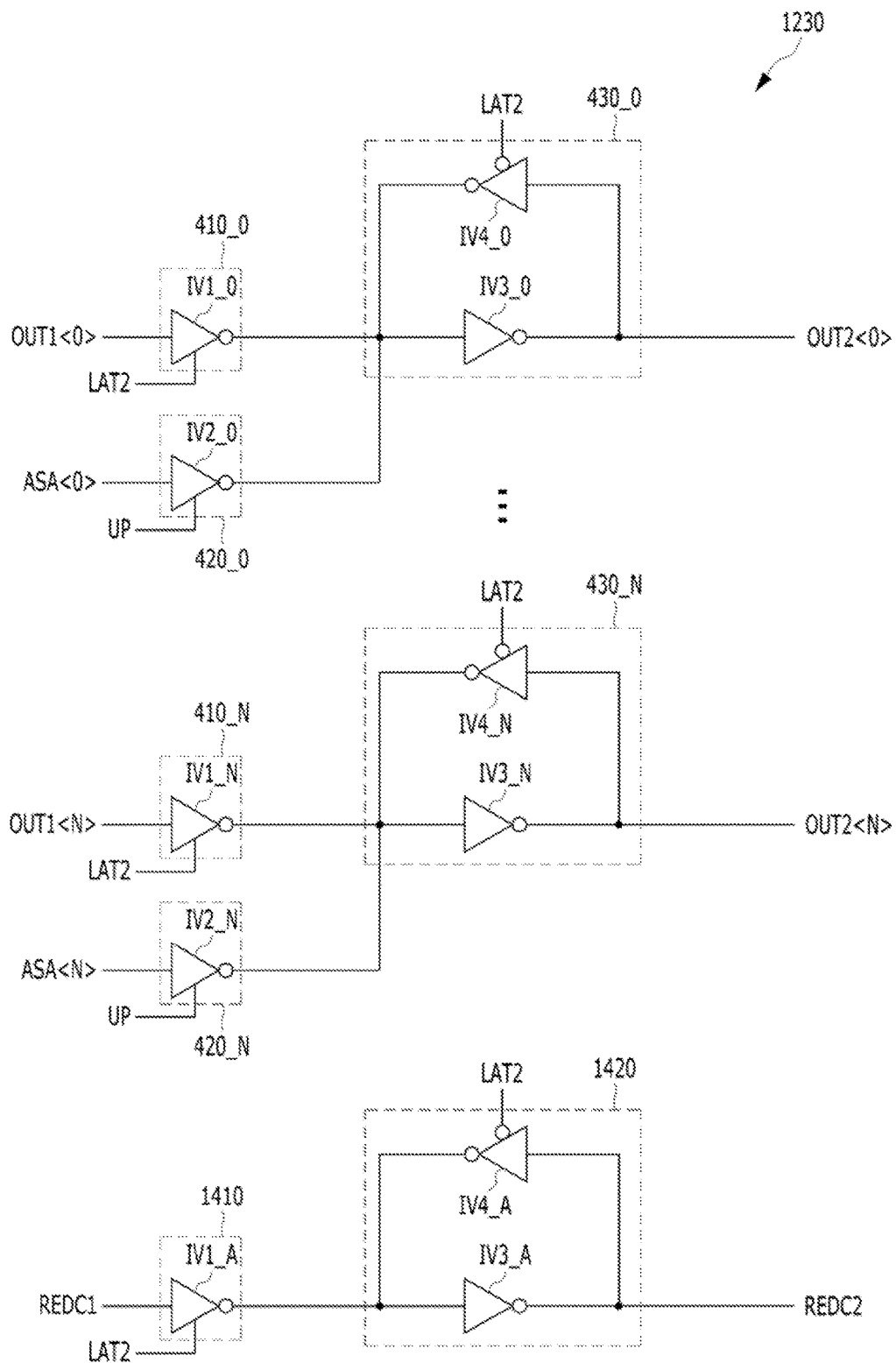
FIG. 14 is a circuit diagram illustrating a second latch unit shown in FIG. 12.

FIG. 14 is a circuit diagram illustrating the second latch unit 1230 shown in FIG. 12.

Referring to FIG. 14, the second latch unit 1230 may further include an input unit 1410 and a latch 1420 corresponding to the redundancy control signal REDC1 in addition to the configuration of the first latch unit 230 of FIG. 4.

The input unit 1410 and the latch 1420 may have the same configuration as the first input units 410_0 to 410_N and the latches 430_0 to 430_N which have been described with reference to FIG. 3, except that the input unit 1410 and the latch 1420 receive the redundancy control signal REDC1 and latch and output the received signal.

Figure 15:
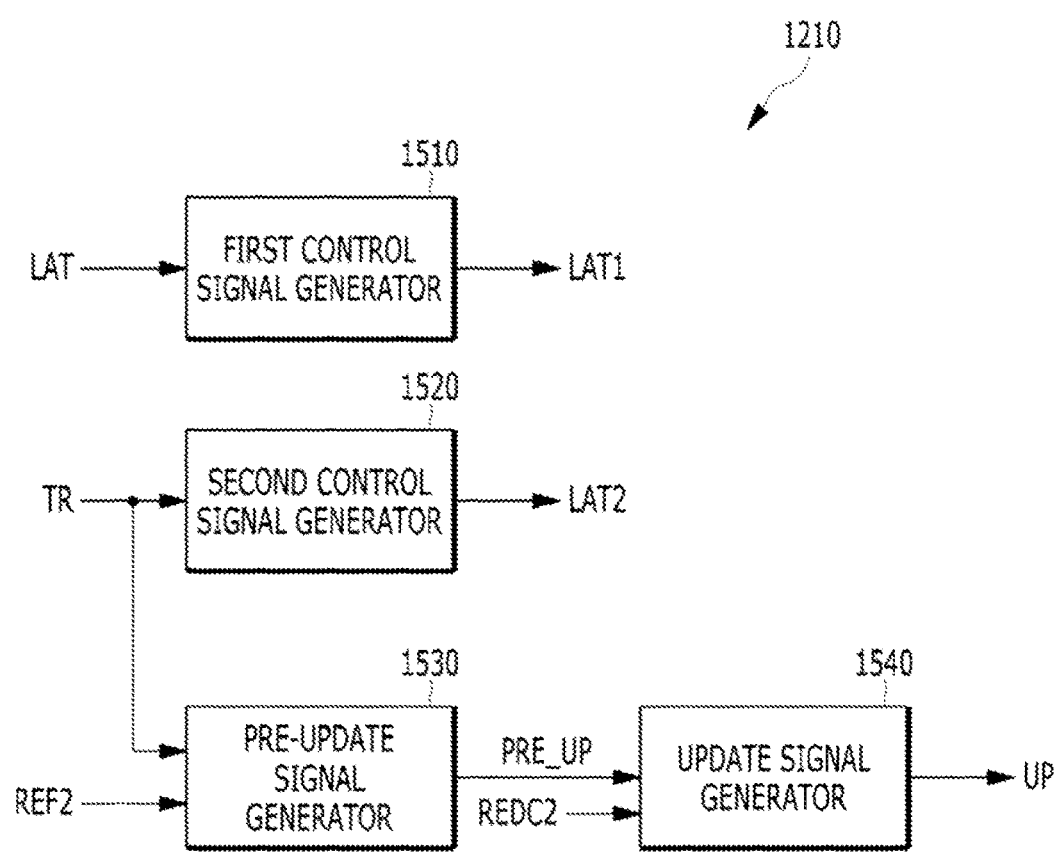
FIG. 15 is a block diagram illustrating latch control unit shown in FIG. 12.

FIG. 15 is a block diagram illustrating the latch control unit 1210 shown in FIG. 12.

Referring to FIG. 15, the latch control unit 1210 may include a first control signal generator 1510, a second control signal generator 1520, a pre-update signal generator 1530, and an update signal generator 1540.

The first control signal generator 1510 may enable the first control signal LAT1 during a predetermined period, when the latch signal LAT is enabled. The predetermined period may correspond to a time required for stably latching the input address IA<0:N> and the redundancy control signal REDC.

The second control signal generator 1520 may generate the enabled second control signal LAT2, and disable the second control signal LAT2 in the period where the target refresh signal TR is enabled.

When the second refresh signal REF2 is enabled for the first time after the target refresh signal TR is enabled, the pre-update signal generator 1530 may enable a pre-update signal PRE_PU. More specifically, when the second refresh signal REF2 is enabled for the first time and then disabled, the pre-update signal generator 1530 may enable the pre-update signal PRE_UP after a predetermined time.

The update signal generator 1540 may transmit the pre-update signal PRE_UP as the update signal UP when the redundancy control signal REDC2 is disabled, or block the pre-update signal PRE_UP and disable the update signal UP when the redundancy control signal REDC2 is enabled.

Figure 16:
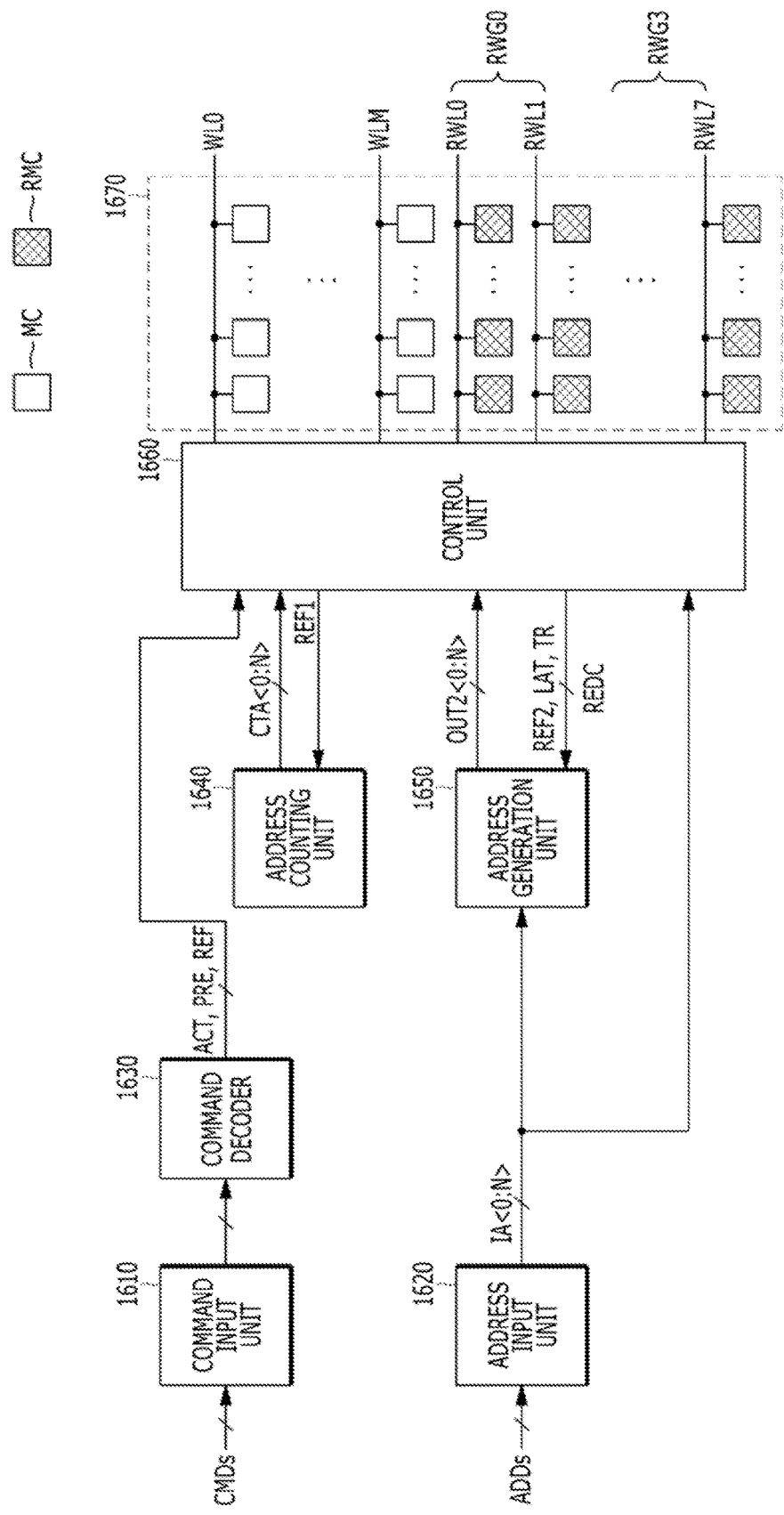
FIG. 16 is a block diagram illustrating a memory device in accordance with an embodiment: of the present invention.

FIG. 16 is a block diagram Illustrating a memory device in accordance with an embodiment of the present invention.

Referring to FIG. 16, the memory device may include a command input unit 1610, an address input unit 1620, a command decoder 1630, an address counting unit 1640, an address generation unit 1650, a control unit 1660, and a cell array 1670.

Referring to FIGS. 12 to 16, the command input unit 1610, the address input unit 1620, the command decoder 1630, the address counting unit 1640, and the cell array 1670 may be the same as the command input unit 610, the address input unit 620, the command decoder 630, the address counting unit 640, and the cell array 670 described with reference to FIG. 6.

The address generation unit 1650 may invert the part or the LSB IA<N> of the input address IA<0:N>, and latch the partly inverted input address IA<0:N> and the redundancy control signal REDC corresponding to the input address IA<0:N> in response to the latch signal LAT, and generate the target address OUT2<0:N> in the period where the target refresh signal TR is enabled. The address generation unit 1650 may be the same as the address generation circuit described with reference to FIG. 12.

The control unit 1660 may be the same as the control unit 660 of the memory device described with reference to FIG. 6 except that the control unit 1660 performs a redundancy operation using the second output address OUT2<0:N>.

When a Kth normal word line WLK is the high active word line or corresponds to the input address IA<0:N> when the latch signal LAT is enabled, a (K−1)th normal word line WLK−1 and a (K+1)th normal word line WLK+1 need to be refreshed. At this time, the (K−1)th normal word line WLK−1 and the (K+1)th normal word line WLK+1 may be selected through the partly inverted input address IA<0:N> and the added/subtracted address ASA<0:N>.

However, when a redundancy word line replacing the Kth normal word line WLK is the high active redundancy word line or corresponds to the input address IA<0:N> when the latch signal LAT is enabled, one of the previous and next redundancy word lines of the high active redundancy word line replacing the Kth normal word line WLK may be selected through the partly inverted input address IA<0:N> while the other one of the previous and next redundancy word lines cannot be selected through the added/subtracted address ASA<0:N>.

For example, suppose that the input address IA<0:N> corresponds to the Kth normal word line WLK, the LSB IA<N> is '0', and the Kth normal word line WLK and the (K+1)th normal word line WLK+1 are replaced with the redundancy word lines RWL4 and RWL5 of the redundancy word line group RWG2. In this case, since the redundancy signal RED2 corresponding to the redundancy word line group RWG2 is enabled in response to the partly inverted input address IA<0:N> and the LSB OUT2<N> of the target address is '1' obtained by inverting the bit IA<N>, the redundancy word line RWL5 may be selected through the redundancy signal RED2 and the LSB OUT2<N> of the target address. However, since the (K−1)th normal word line WLK−1 corresponding to the added/subtracted address ASA<0:N> belongs to a different word line group from the Kth normal word line WLK, it is impossible to determine whether the (K−1)th normal word line WLK−1 has been replaced. Although the (K−1)th normal word line WLK−1 has been replaced, it is impossible to guarantee that the (K−1)th normal word line WLK−1 has been replaced with the redundancy word line RWL3.

Thus, the memory device described with reference to FIG. 6 may separately store the partly inverted input address IA<0:N> in the third latch unit 240 and use the stored address for the redundancy operation in the target refresh period in order to enable the redundancy signal RED2 for selecting the redundancy word line RWL3 during the target refresh operation in the target refresh period. However, when the normal word line corresponding to the input address IA<0:N> is replaced in the target refresh period, the memory device of FIG. 16 may maintain the partly inverted input address IA<0:N> latched in the second latch unit 1230 as the target address OUT2<0:N>, and use the partly inverted input address IA<0:N> in the redundancy operation during the target refresh operation in the target refresh period. Thus, the memory device of FIG. 16 does not need the third latch unit.

Figure 17:
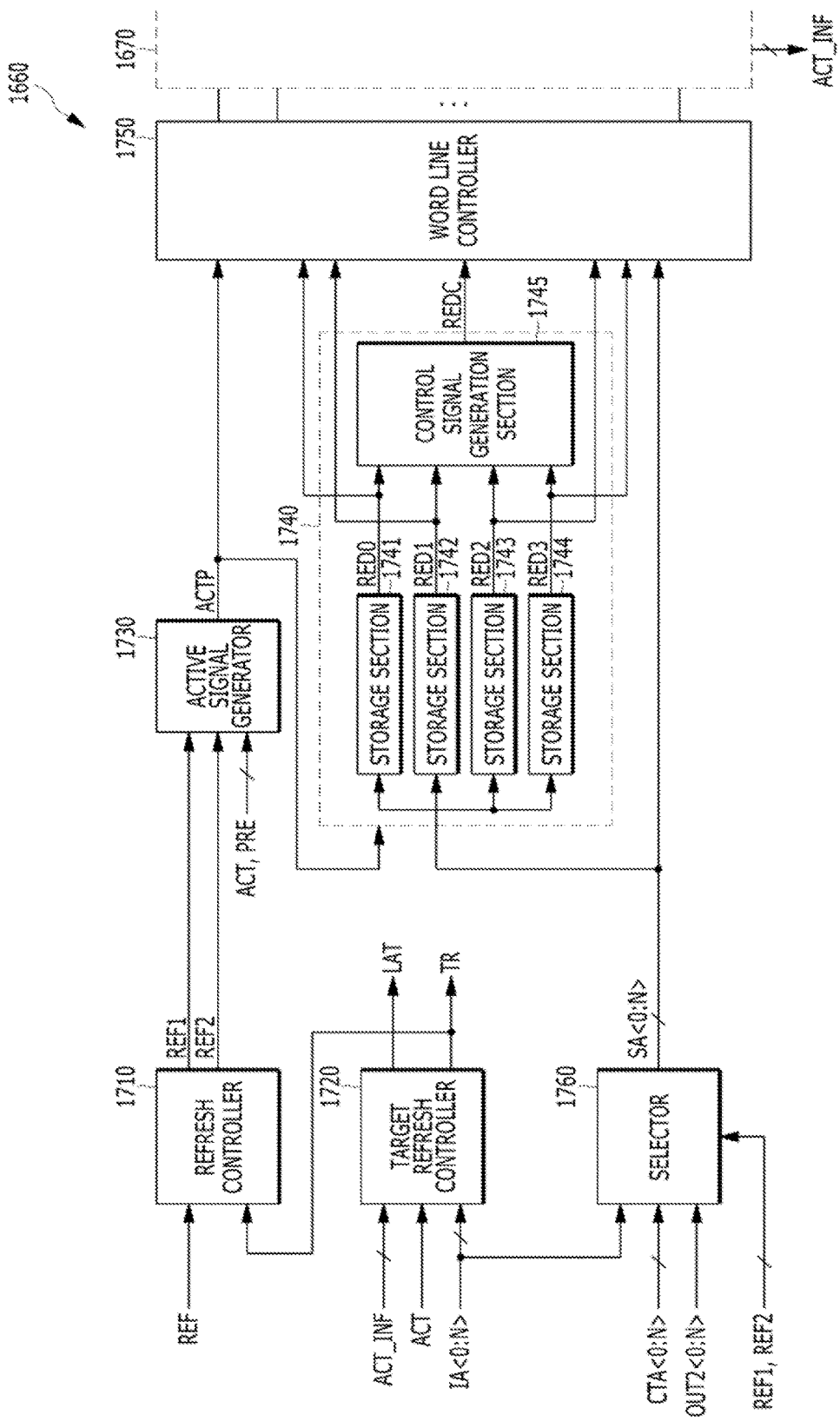
FIG. 17 is a block diagram illustrating a control unit shown in FIG. 16.

FIG. 17 is a block diagram illustrating the control unit 1660 shown in FIG. 16.

Referring to FIG. 17, the control unit 1660 may include a refresh controller 1710, a target refresh controller 1720, an active signal generator 1730, a redundancy control section 1740, a word line control section 1750, and a selector 1760.

Since the control unit 1660 of FIG. 17 does not receive the third output address OUT3<0:N>, unlike the control unit 660 described with reference to FIG. 7, the control unit 1660 includes only one selector 1760, and an address SA<0:N> selected through the selector 1760 is inputted to the redundancy control section 1740 and the word line control section 1750. The redundancy control section 1740 and the word line control section 1750 may receive the same address SA<0:N> and perform the operations described with reference to FIG. 7.

The refresh controller 1710, the target refresh controller 1720, and the active signal generator 1730 of FIG. 17 may be the same as the refresh controller 710, the target refresh controller 720, and the active signal generator 730 described with reference to FIG. 7.

Figure 18:
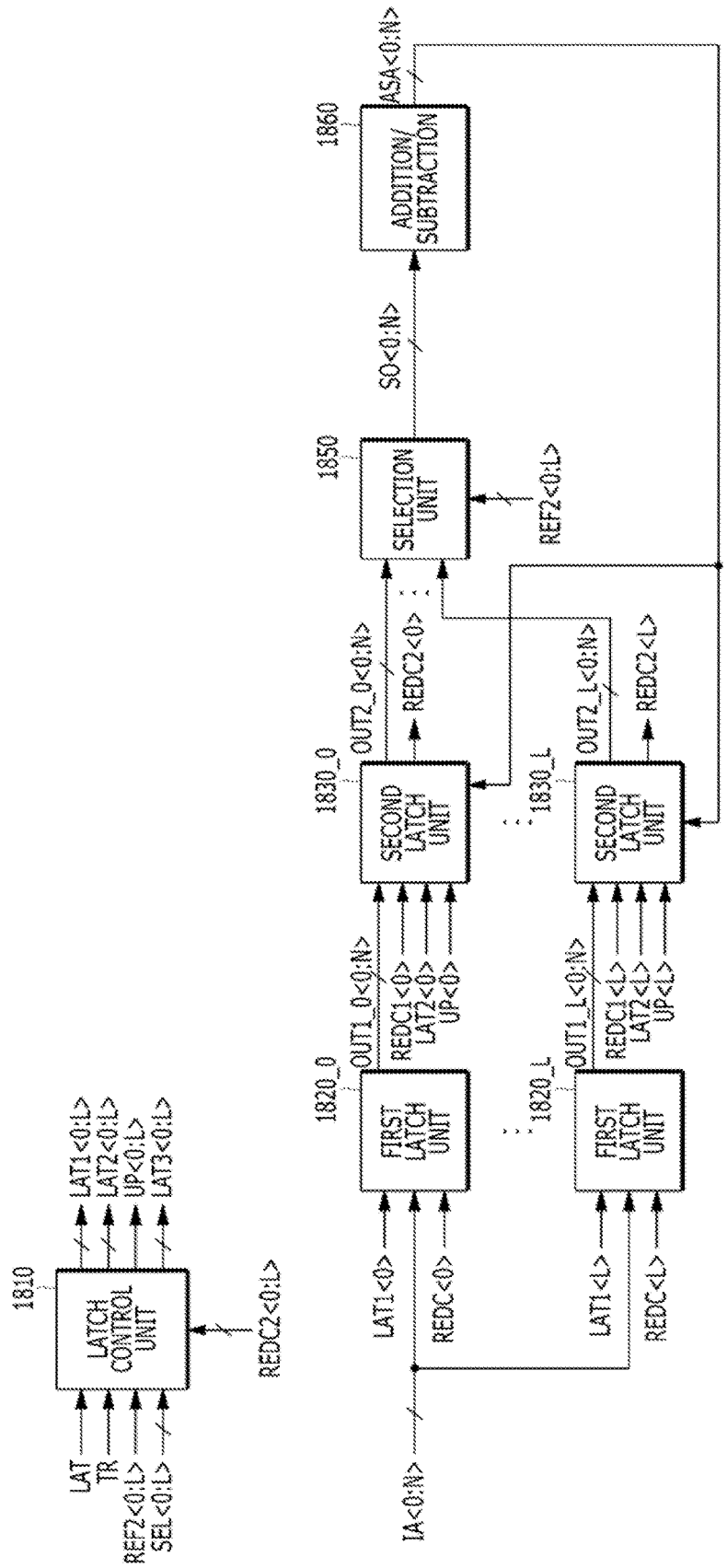
FIG. 18 is a block diagram illustrating an address generation circuit in accordance with an embodiment of the present invention.

FIG. 18 is a block diagram illustrating an address generation circuit in accordance with an embodiment of the present invention.

Referring to FIG. 18, the address generation circuit may include a latch control unit 1810, a plurality of first latch units 1820_0 to 1820_L, a plurality of latch units 1830_0 to 1830_L, a selection unit 1840, and an addition/subtraction unit 1850.

The address generation circuit of FIG. 18 may additionally latch the redundancy control signal REDC<0:L>, unlike the address generation circuit described with reference to FIG. 9. The redundancy control signal REDC<0:L> may be enabled when a word line corresponding to the input address IA<0:N> is replaced with a redundancy word line, and may be disabled when the word line corresponding to the input address IA<0:N> is not replaced with a redundancy word line. Using the redundancy control signal REDC<0:L> during the second refresh operation of the target refresh period, the address generation circuit may update the value of the target addresses OUT2_0<0:N> to OUT2_L<0:N> to the addition/subtraction ASA<0:N> or maintain the target addresses OUT2_0<0:N> to OUT2_L<0:N> to the partly inverted input address IA<0:N>, which is the same as the input address IA<0:N> except for the LSB IA<N>.

In the address generation circuit of FIG. 18, the first latch units 1820_0 to 1820_L and the second latch units 1830_0 to 1830_L may additionally latch the redundancy control signal REDC<0:L>, and determine whether to update the target addresses OUT2_0<0:N> to OUT2_L<0:N> of the second latch units 1830_0 to 1830_L to the addition/subtraction ASA<0:N> based on the latched redundancy control signal REDC<0:L>. Thus, the address generation circuit does not need the third latch units 940_0 to 940_L unlike the address generation circuit described with reference to FIG. 9. Therefore, the address generation circuit may reduce the circuit area while supporting the same operations as the address generation circuit described with reference to FIG. 9.

The latch control unit 1810 may generate signals LAT1<0:L>, LAT2<0:L>, and UP<0:L> for controlling the plurality of first and second latch units 1820_0 to 1820_L and 1830_0 to 1830_L. The latch control unit 1810 may enable first control signals LATA1<0:L> corresponding to enabled select signals SEL<0:L> among the first control signal LAT1<0:L> when a latch signal LAT is enabled. The latch control unit 1810 may maintain the second control signals LAT2<0:L> enabled, and disable the second control signals LAT2<0:L> in a period where a target refresh signal TR is enabled.

The latch control unit 1810 may enable the update signals UP<0:L> when the corresponding redundancy control signals REDC2<0:L> are disabled after the second refresh signal REF2<L> is enabled for the first time in the period where the target refresh signal TR is enabled. Furthermore, the latch control unit 1810 may disable the update signals UP<0:L> when the corresponding redundancy control signals REDC2<0:L> are enabled.

The first latch units 1820_0 to 1820_L may invert a part of the input address IA<0:N>, for example, a least significant bit (LSB) IA<N> of the input address IA<0:N>, latch the partly inverted input address IA<0:N> and redundancy control signals REDC<0:L> corresponding to the input address IA<0:N>, and output the latched addresses and the redundancy control signals REDC<0:L> as first output addresses OUT1_0<0:N> to OUT1_L<0:N> and redundancy control signals REDC1<0:L> when the corresponding first control signals LAT1<0:L> are enabled.

The second latch units 1830_0 to 1830_L may receive the outputs OUT1_0<0:N> to OUT1_L<0:N> and REDC1<0:L> of the corresponding first latch units 1820_0 to 1820_L, latch the received addresses and the redundancy control signals REDC<0:L>, and output the latched addresses and the redundancy control signals REDC<0:L> as second output addresses OUT2_0<0:N> to OUT2_L<0:N> and the redundancy control signals REDC2<0:L> in a period where the corresponding second control signals LAT2<0:L> are enabled. The second latch units 1830_0 to 1830_N may maintain the latched values therein without reception of the outputs OUT1_0<0:N> to OUT1_L<0:N> and REDC1<0:L> of the corresponding first latch units 1820_0 to 1820_L in a period where the corresponding second control signals LAT2<0:L> are disabled. The second latch units 1830_0 to 1830_L may receive and latch the added/subtracted address ASA<0:N> outputted from the addition/subtraction unit 1860 when the corresponding update signals UP<0:L> are enabled.

Each of the first latch units 1820_0 to 1820_L of FIG. 18 may be the same as the first latch unit 1220 described above with reference to FIGS. 12 and 13, and each of the second latch units 1830_0 to 1830_L may be the same as the second latch unit 1230 described above with reference to FIGS. 12 and 14.

The selection unit 1840 and the addition/subtraction unit 1850 may be the same as the selection unit 950 and the addition/subtraction unit 960 described with reference to FIG. 9.

Each of the second output addresses OUT2_0<0:N> to OUT2_L<0:N> may be a target address for selecting a word line of the corresponding bank during a target refresh operation in the memory device or an address for controlling a redundancy operation of the corresponding bank. Each of the second output addresses OUT2_0<0:N> to OUT2_L<0:N> may be the partly inverted input address IA<0:N> of the corresponding bank during the first refresh operation in the target refresh period. Furthermore, each of the second output addresses OUT2_0<0:N> to OUT2_L<0:N> may be the added/subtracted address ASA<0:N> when the corresponding bank does not perform the redundancy operation during the second refresh operation in the target refresh period, and may be the partly inverted input address IA<0:N> when the corresponding bank performs the redundancy operation.

In other words, during the first refresh operation of the target refresh period, the second output addresses or the target addresses OUT2_0<0:N> to OUT2_L<0:N> may be the partly inverted input address IA<0:N> inputted to the corresponding latch units 1820_0 to 1820_L. Furthermore, during the second refresh operation in the target refresh period, the target addresses OUT2_0<0:N> to OUT2_L<0:N> may be the added/subtracted address ASA<0:N> when a corresponding one of the latched redundancy control signals REDC2<0:N> is disabled, and may be the partly inverted input address IA<0:N> inputted to the corresponding first latch units 1820_0 to 1820_L when a corresponding one of the latched redundancy control signals REDC2<0:N> is enabled.

Figure 19:
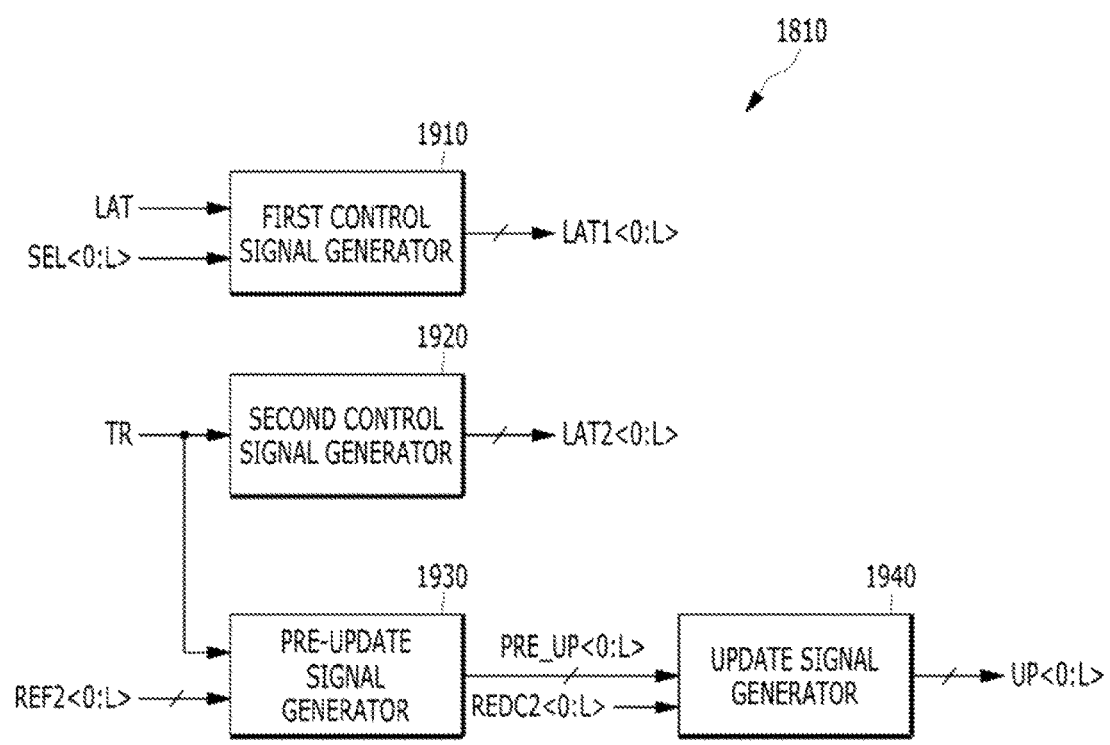
FIG. 19 is a block diagram illustrating a latch control unit shown in FIG. 18.

FIG. 19 is a block diagram illustrating the latch control unit 1810 shown in FIG. 18.

Referring to FIG. 19, the latch control unit 1810 may include a first control signal generator 1910, a second control signal generator 1920, a pre-update signal generator 1930, and an update signal generator 1940.

The first control signal generator 1910 may enable a first control signal corresponding to an enabled select signal among the select signals SEL<0:L> during a predetermined period, when the latch signal LAT is enabled. The predetermined period may correspond to the time required for stably latching the input address IA<0:N> and the redundancy control signal REDC<0:L>.

The second control signal generator 1920 may generate the enabled second control signals LAT2<0:L>, and disable the second control signals LAT2<0:L> in the period where the target refresh signal TR is enabled.

When the second refresh signal REF2<L> is enabled for the first time after the target refresh signal TR is enabled, the pre-update signal generator 1930 may sequentially enable a plurality of pre-update signals PRE_UP<0:L> in response to the select signals REF2<0:L>. More specifically, when the second refresh signal REF2<L> is enabled for the first time and then disabled, the pre-update signal generator 1930 may sequentially enable the pre-update signals PRE_UP<0:L> in response to the select signals REF2<0:L> which are sequentially enabled after a predetermined time.

The update signal generator 1940 may transmit the pre-update signals PRE_UP<0:L> as the corresponding update signals UP<0:L> when the corresponding redundancy control signals REDC2<0:L> are disabled, or block the pre-update signals PRE_UP<0:L> and disable the corresponding update signals UP<0:L> when the corresponding redundancy control signals REDC2<0:L> are enabled.

Figure 20:
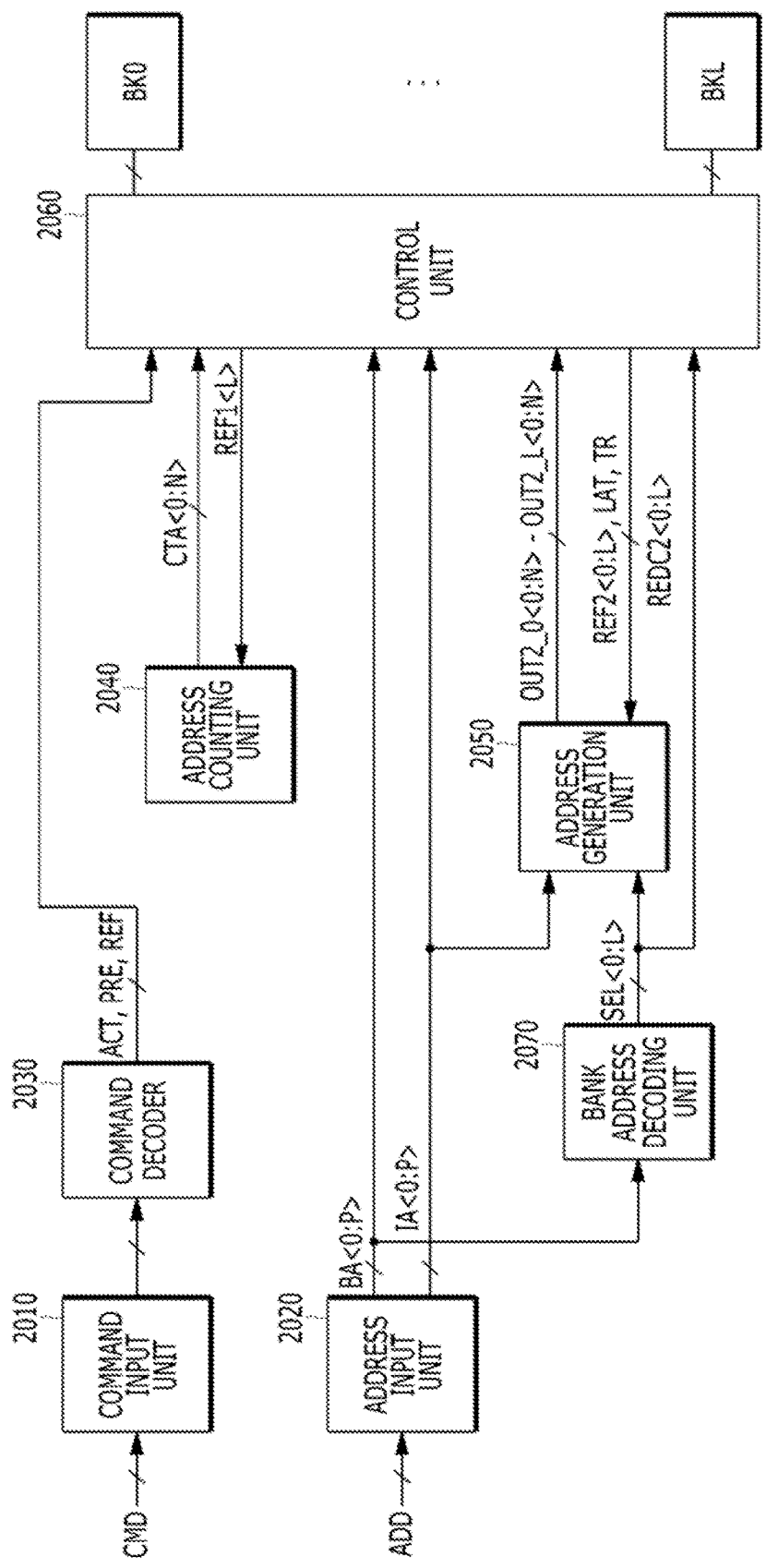
FIG. 20 is a block diagram illustrating a memory device in accordance with an embodiment of the present invention.

FIG. 20 is a block diagram illustrating a memory device in accordance with an embodiment of the present invention.

Referring to FIG. 20, the memory device may include a command input unit 2010, an address input unit 2020, a command decoder 2030, an address counting unit 2040, an address generation unit 2050, a control unit 2060, a bank address decoding unit 2070, and a plurality of banks BK0 to BKL. Each of the banks BK0 to BKL may correspond to the cell array 1670 of FIG. 16.

Referring to FIGS. 18 to 20, the command input unit 2010, the address input unit 2020, the command decoder 2030, and the address counting unit 2040 may be the same as the command input unit 1610, the address input unit 1620, the command decoder 1630, and the address counting unit 1640 described with reference to FIG. 16.

The address input unit 2020 may further transfer a bank address BA<0:P> for selecting one or more banks of a plurality of banks BK0 to BKL to the control unit 2060 and the bank address decoding unit 2070. Furthermore, the address counting unit 2040 may increase the value of the counting address CTA<0:N> by 1 whenever the first refresh signal REF1<L>, which is enabled last among the plurality of first fresh signals REF1<0:L>, is enabled.

The first and second latch units 1820_0 to 1820_L and 1830_0 to 1830_L of FIG. 18 may correspond to the plurality of banks BK0 to BKN, respectively, and latch and generate an address and a redundancy control signal which are required for the operation of the corresponding bank.

The bank address decoding unit 2070 may decode the bank address BA<0:P> and generate select signals SEL<0:L>. The select signals SEL<0:L> may correspond to the select signals SEL<0:L> described above with reference to FIG. 18.

When the latch signal LAT is enabled, the address generation unit 2050 may invert the part or the LSB IA<N> of the input address IA<0:N>, and latch the partly inverted input address IA<0:N> and the redundancy control signal REDC<0:L> corresponding to the input address IA<0:N> through a selected one among the first latch units 1820_0 to 1820_L in response to the latch signal LAT, and generate the target address OUT2<0:N> in the period where the target refresh signal TR is enabled. The address generation unit 2050 may be the same as the address generation circuit described above with reference to FIG. 18.

The control unit 2060 may be the same as the control unit 1060 of the memory device described above with reference to FIG. 10 except that the control unit 2060 performs a redundancy operation using the second output addresses OUT2_0<0:N> to OUT2_L<0:N>.

Figure 21:
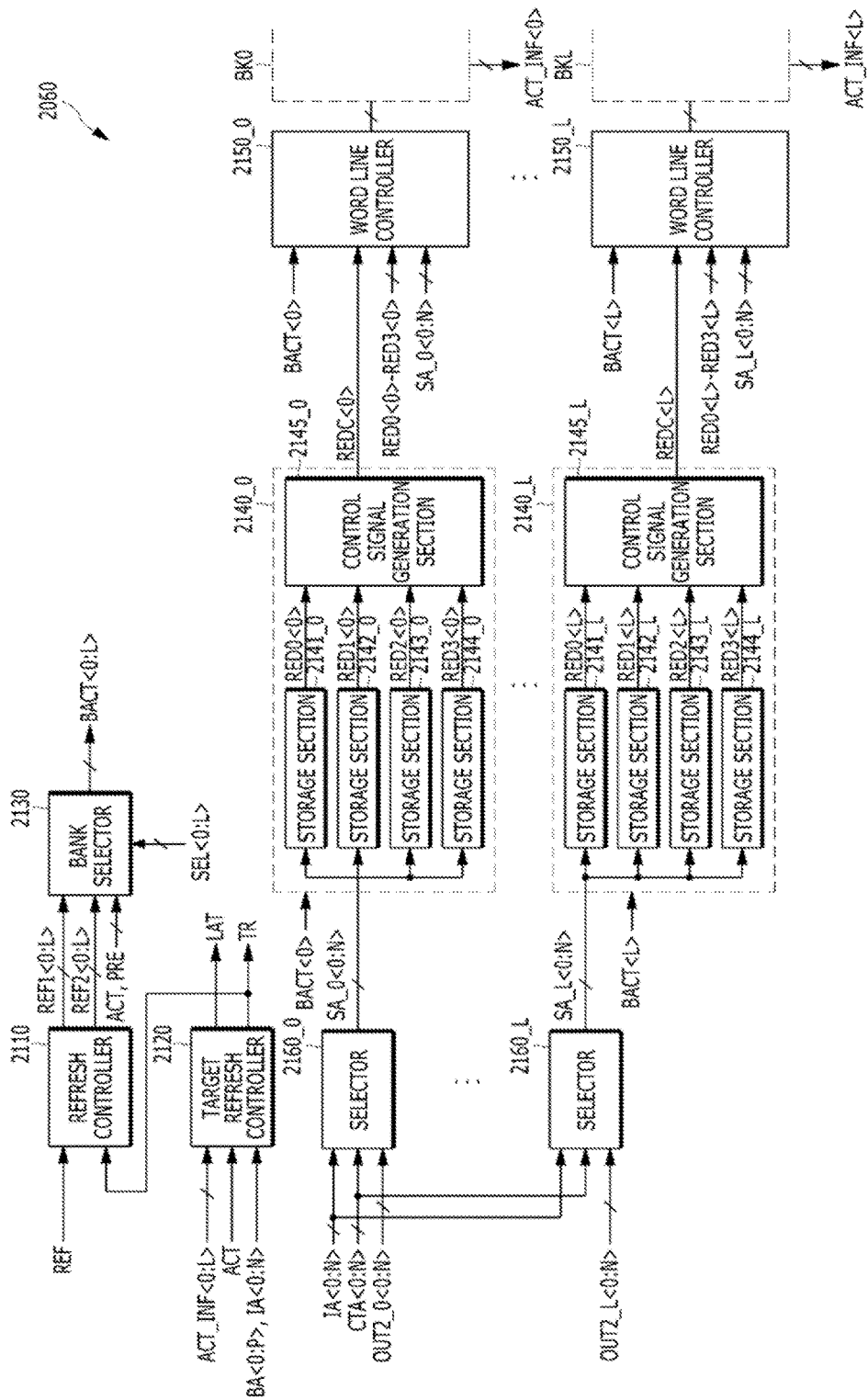
FIG. 21 is a block diagram illustrating a control unit shown in FIG. 20.

FIG. 21 is a block diagram illustrating the control unit 2060 shown in FIG. 20.

Referring to FIG. 21, the control unit 2060 may include a refresh controller 2110, a target refresh controller 2120, a bank selector 2130, a plurality of redundancy control sections 2140_0 to 2140_L, a plurality of word line control sections 2150_0 to 2150_L, and a plurality of selectors 2160_0 to 2160_L.

Since the control unit 2060 of FIG. 21 does not receive the third output addresses OUT3_0<0:N> to OUT3_L<0:N> unlike the control unit 1060 described above with reference to FIG. 11, the control unit 2060 may include only one kind of selectors 2160_0 to 2160_L, and addresses SA_0<0:N> to SA_L<0:N> selected through the selectors 2160_0 to 2160_L may be inputted to the redundancy control sections 2140_0 to 2140_L and the word line control sections 2150_0 to 2150_L, respectively. The plurality of word line control sections 2150_0 to 2150_L and the plurality of selectors 2160_0 to 2160_L may receive the same addresses SA_0<0:N> to SA_L<0:N>, respectively, and perform the operations described with reference to FIG. 11.

The refresh controller 2110, the target refresh controller 2120, and the bank selector 2130 of the control unit 2060 of FIG. 21 may be the same as the refresh controller 1110, the target refresh controller 1120, and the bank selector 1130 described above with reference to FIG. 11.

In accordance with the embodiments of the present invention, the address generation circuit and the memory device may latch an activated address and generate an address used when a target refresh operation is performed, thereby preventing damage of memory cell data.

Furthermore, the address generation circuit and the memory device may maintain a latched address or update the latched address into an added/subtracted value according to whether a redundancy operation is performed, thereby reducing the circuit area and the number of latches required for generating an address used when a target refresh operation is performed.

Although various embodiments have been described for illustrative purposes, it will be apparent to those skilled in the art that various changes and modifications may be made without departing from the spirit and scope of the invention as defined in the following claims.

What is claimed is:

1. An address generation circuit comprising:
    a first latch unit configured to latch an address obtained by inverting a part of an input address and a redundancy control signal which is generated by a control signal generation section of a control unit and corresponds to the input address, wherein the redundancy control signal is enabled when a word line corresponding to the input address is replaced with a redundancy word line;
    a second latch unit configured to latch the address and the redundancy control signal of the first latch unit, configured to latch an added/subtracted address after a first refresh operation performed by the control unit during a target refresh operation performed by the control unit wherein the address latched in the second latch unit is a target address when the redundancy control signal is disabled, and configured to maintain the address when the redundancy control signal is enabled; and
    an addition/subtraction unit configured to generate the added/subtracted address by adding/subtracting a predetermined value to/from the address of the second latch unit.

2. The address generation circuit of claim 1, wherein the part of the input address comprises a least significant bit of the input address.

3. The address generation circuit of claim 2, wherein the addition/subtraction unit generates the added/subtracted address by adding or subtracting the predetermined value to or from the address of the second latch unit according to the least significant bit of the address of the second latch unit.

4. A memory device comprising:
    a cell array comprising a plurality of word lines and a plurality of redundancy word lines;
    a first latch unit configured to latch an address obtained by inverting a part of an input address and a redundancy control signal corresponding to the input address, wherein the redundancy control signal is enabled when a word line corresponding to the input address is replaced with a redundancy word line;

a second latch unit configured to latch the address and the redundancy control signal of the first latch unit, configured to latch an added/subtracted address after a first refresh operation during a target refresh operation in which the address latched in the second latched unit is a target address when the redundancy control signal is disabled, and configured to maintain the address when the redundancy control signal is enabled;

an addition/subtraction unit configured to generate the added/subtracted address by adding/subtracting a predetermined value to/from the address of the second latch unit; and a control unit configured to refresh a word line or redundancy word line corresponding to a counting address, and configured to refresh a word line or redundancy word line corresponding to the address of the second latch unit during the target refresh operation and then generate the redundancy control signal, wherein the counting address changes when the cell array is refreshed.

5. The memory device of claim 4, wherein the part of the input address comprises a least significant bit of the input address.

6. The memory device of claim 5, wherein the addition/subtraction unit generates the added/subtracted address by adding or subtracting the predetermined value to or from the address of the second latch unit according to the least significant bit of the address of the second latch unit.

7. The memory device of claim 4, wherein the input address is inputted during an active operation.

8. The memory device of claim 7,
wherein the control unit refreshes a single word line or a single redundancy word line in response to a refresh command, and
wherein, during the target refresh period, the control unit performs the first refresh operation in response to a first application of the refresh command, and performs a second refresh operation in response to a second application of the refresh command.

9. The memory device of claim 8, wherein the control unit performs the active operation between the first refresh operation and the second refresh operation.

10. The memory device of claim 4, wherein the control unit comprises:
a redundancy control section configured to activate one among a plurality of redundancy signals corresponding to a redundancy word line replacing a word line, which corresponds to the counting address or the partly inverted input address of the second latch unit, when the word line is replaced with the redundancy word line; and
a word line control section configured to select the word line or the redundancy word line in response to the counting address, the address of the second latch unit, and the plurality of redundancy signals.

11. A memory device comprising:
a plurality of banks each comprising a plurality of word lines and a plurality of redundancy word lines;
a plurality of first latch units each configured to latching an address obtained by inverting a part of an input address of a corresponding bank among the plurality of banks and a redundancy control signal, wherein the redundancy control signal is enabled when a word line corresponding to the input address is replaced;
a plurality of second latch units each configured to latch the address and the redundancy control signal of a corresponding first latch unit among the plurality of first latch units, configured to latch an added/subtracted address after a first refresh operation during a target refresh operation when the redundancy control signal is disabled, and configured to maintain the address when the redundancy control signal is enabled;
an addition/subtraction unit configured to generate the added/subtracted address by adding or subtracting a predetermined value to or from the address of the selected second latch unit; and
a control unit configured to refresh a word line or redundancy word line of the plurality of banks that corresponds to a counting address, and configured to refresh word lines or redundancy word lines of the plurality of banks corresponding to the latched addresses in the second latch units in the plurality of banks during the target refresh operation and then generate the redundancy control signal,
wherein the counting address changes when a cell array comprising the plurality of banks is refreshed.

12. The memory device of claim 11, wherein the partly inverted input address of each of the first latch units corresponds to a word line adjacent to a word line corresponding to the input address of the corresponding bank.

13. The memory device of claim 12, wherein the addition/subtraction unit generates the added/subtracted address by adding or subtracting the predetermined value to or from the latched address of the selected second latch unit according to the least significant bit of the latched address of the selected second latch unit.

14. The memory device of claim 11,
wherein the control unit refreshes a single word line or a single redundancy word line in the plurality of banks in response to a refresh command, and
wherein, during the target refresh period, the control unit performs the first refresh operation in response to a first application of the refresh command, and performs a second refresh operation in response to a second application of the refresh command.

* * * * *